(12) United States Patent
Vandersteegen et al.

(10) Patent No.: US 10,816,318 B2
(45) Date of Patent: Oct. 27, 2020

(54) MEASURING AN ABSOLUTE ANGULAR POSITION

(71) Applicant: Melexis Technologies SA, Bevaix (CH)

(72) Inventors: Peter Vandersteegen, Deurne (BE); Jean-Claude Depoorter, Paal (BE); Samuel Huber Lindenberger, Jenaz (CH)

(73) Assignee: Melexis Technologies SA, Bevaix (CH)

( * ) Notice: Subject to any disclaimer, the term of this patent is extended or adjusted under 35 U.S.C. 154(b) by 117 days.

(21) Appl. No.: 15/812,665

(22) Filed: Nov. 14, 2017

(65) Prior Publication Data

US 2018/0135961 A1    May 17, 2018

(30) Foreign Application Priority Data

Nov. 14, 2016 (EP) .................................... 16198764

(51) Int. Cl.
*G01B 7/30* (2006.01)
*G01D 5/14* (2006.01)
(Continued)

(52) U.S. Cl.
CPC .............. *G01B 7/30* (2013.01); *G01D 5/145* (2013.01); *G01D 5/24428* (2013.01); *G01R 33/077* (2013.01)

(58) Field of Classification Search
CPC ............ G01D 5/145; G01D 5/12; G01D 5/14; G01D 5/142; G01D 5/2451; G01D 5/2442;
(Continued)

(56) References Cited

U.S. PATENT DOCUMENTS

2002/0021124 A1    2/2002  Schott et al.
2012/0268109 A1*  10/2012  Mehnert ............... G01P 3/4815
                                                        324/207.15
(Continued)

FOREIGN PATENT DOCUMENTS

EP          0916074 A1      5/1999
EP          2674728 A2      12/2013
(Continued)

OTHER PUBLICATIONS

European Search Report from EP Application No. 16198764.9, dated Apr. 26, 2017.
(Continued)

*Primary Examiner* — Tung X Nguyen
*Assistant Examiner* — Feba Pothen
(74) *Attorney, Agent, or Firm* — Workman Nydegger

(57) ABSTRACT

A magnetic sensor arrangement, comprising: a magnet assembly and a magnetic sensor; the magnet assembly forming a magnetic field having at least two magnetic field components with different angular periodicities at the location of the magnetic sensor and the magnetic sensor including means for sensing the different magnetic field components to produce at least a first and a second sensor element signal; and a computing element for receiving the at least first and second sensor element signals and combining them to produce a unique angular position of the magnet relative to the sensor. A method of determining a unique angular position is also provided.

15 Claims, 29 Drawing Sheets

(51) Int. Cl.
*G01R 33/07* (2006.01)
*G01D 5/244* (2006.01)

(58) Field of Classification Search
CPC ........ G01R 33/07; G01R 33/077; G01B 7/30; G04C 5/00; H02K 49/102
See application file for complete search history.

(56) References Cited

U.S. PATENT DOCUMENTS

| | | |
|---|---|---|
| 2013/0200885 A1 | 8/2013 | Asano et al. |
| 2015/0022192 A1* | 1/2015 | Ausserlechner ....... G01D 5/145 324/207.25 |
| 2015/0070002 A1 | 3/2015 | Schott |
| 2015/0226581 A1* | 8/2015 | Schott .................... G01D 5/145 324/207.2 |
| 2016/0216132 A1 | 7/2016 | Ausserlechner |
| 2017/0268903 A1* | 9/2017 | Kranz .................... G01B 7/003 |

FOREIGN PATENT DOCUMENTS

| | | |
|---|---|---|
| KR | 20080083143 A | 9/2008 |
| WO | 2007084349 A1 | 7/2007 |
| WO | 2014029885 A1 | 2/2014 |

OTHER PUBLICATIONS

Korean Office Action from corresponding KR Application No. 10-2017-0149408, dated Jul. 12, 2019.

* cited by examiner

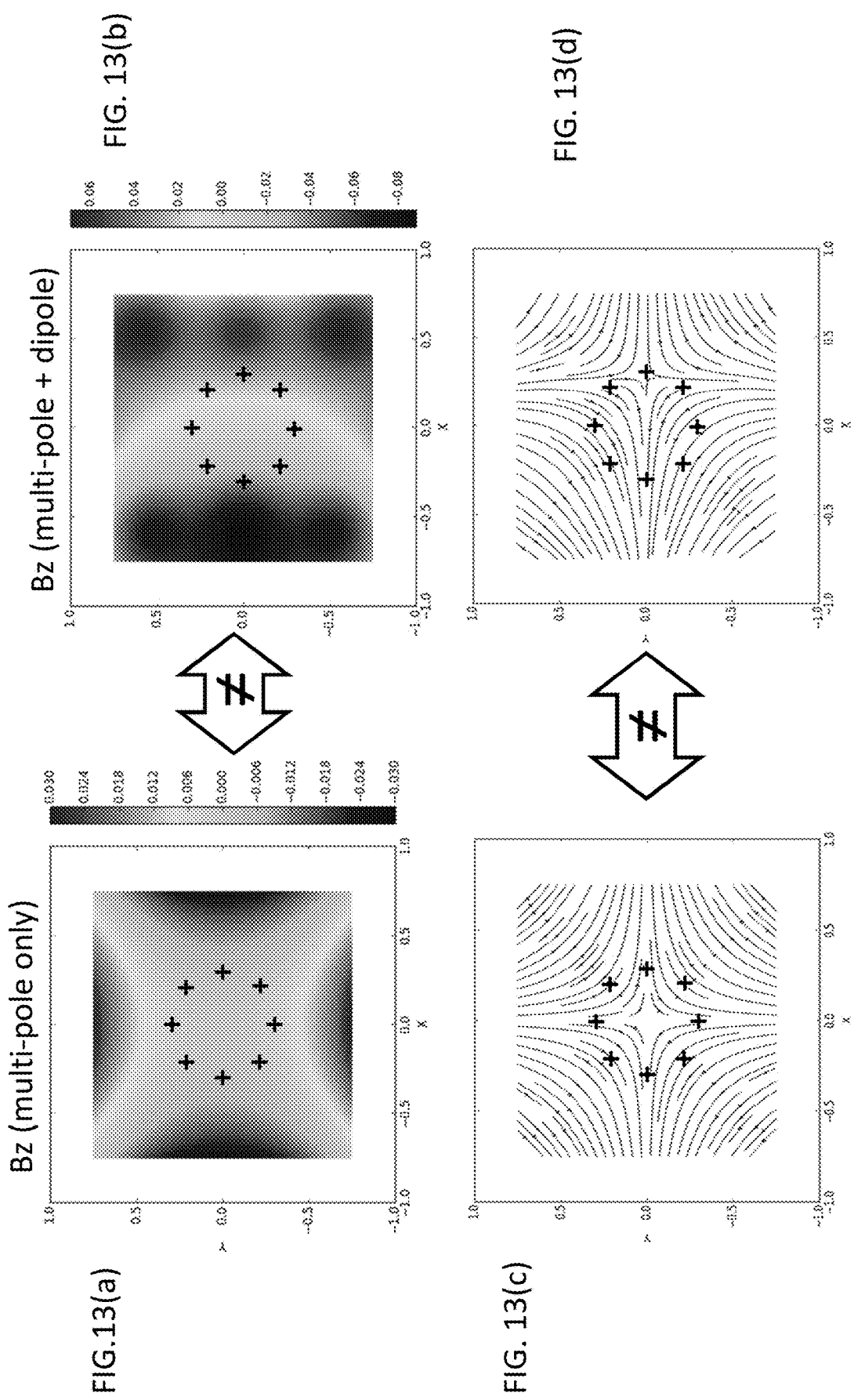

Bxy

S1=0, S2=0, (perpendicular)
(U1+U2)=0 (symmetry),
(T1+T2)=0 (symmetry),
(V1+V2)=0 (symmetry),
diff1=ΣS−ΣU=0,
diff2=ΣT−ΣV=0,
=> no influence of Bs on α1

(S1+S2)=0 (symmetry),
U1=U2=0, (perpendicular)
(T1+T2)=0 (symmetry),
(V1+V2)=0 (symmetry),
diff1=ΣS−ΣU=0,
diff2=ΣT−ΣV=0,
=> no influence of Bs on α1

Assume primary angle α1 = ⬅
FIG. 20(a)
Then the real angle α is either equal to α1 or α1+180°:
FIG. 20(b)
Assume Bfremd = ↙ Bfremd
FIG. 20(c)
Asume that the secondary angle α2 was calculated / estimated as:
⬅ Bs_estimate
FIG. 20(d)
Then the real secondary field Bs is:
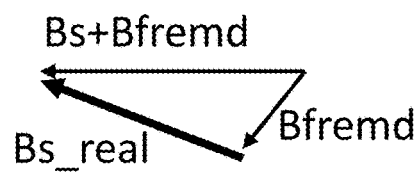
FIG. 20(e)
Result is correct if |Bs_real| > |Bfremd|:
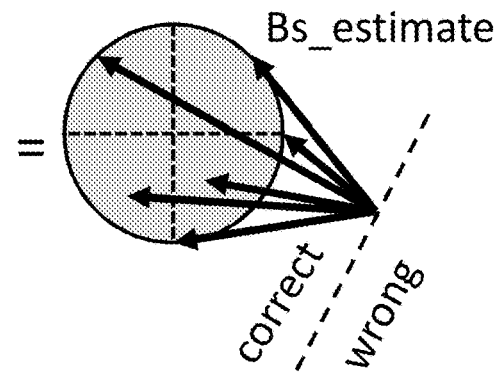
FIG. 20(f)
FIG. 20(g)

MEASURING AN ABSOLUTE ANGULAR POSITION

FIELD OF THE INVENTION

The present invention relates to the field of angular position sensors using a magnetic field. More in particular, the present invention relates to a contactless arrangement and a method for determination of an angular position in a range from 0° to 360°, using a particular magnet, and a sensor device and such a magnet.

BACKGROUND OF THE INVENTION

The measurement of a rotation angle is required in various applications, such as manual electrical switches or position detection of a motor or a valve or the like. Depending on cost and accuracy constraints, this task can be accomplished by various methods, such as mechanical contacts, potentiometers, optical encoders, or magnetic encoders.

Modern integrated circuit technology offers the possibility to integrate magnetic sensors and their readout circuitry, and angle calculation electronics on a single chip. This allows providing detectors of mechanical rotation which consist of a permanent magnet attached to a rotor and a monolithically integrated sensor attached to a stator, at competitive cost and good performance. The absence of mechanical contact between the rotor with the magnet and the stator with the sensor allows for hermetic encapsulation of the sensor. This permits wear-free angle measurements under harsh environmental conditions.

With the increase of compactness of electrical systems, particularly in automobiles with the arrival of hybrid engine systems, such position sensors are additionally exposed to external magnetic fields from nearby current conductors carrying strong current (e.g. more than 100 A). To maintain high sensing accuracy under such conditions, the sensor can be shielded by a ferromagnetic shield, or should be made intrinsically robust towards such fields.

EP0916074B1 describes an angular position sensor capable of measuring an angle in the range from 0° to 360°.

US20020021124 describes a position sensor using one or more so-called magnetic field concentrators (abbreviated "IMC") to bend magnetic field lines, in combination with either horizontal Hall elements located under the IMC, or vertical Hall elements located tangentially to the edge of the IMC.

WO2014029885(A1), further abbreviated as WO'885, filed by the same applicant as the present invention, describes an arrangement for measuring an angular position, comprising a multi-pole magnet and a sensor comprising a plurality of sensor elements arranged on a circle. Two algorithms for calculating the angular position are disclosed. Although the sensors described therein offer several advantageous features, such as insensitivity to an external field ("Fremdfeld"), a disadvantage of this arrangement is that the angular position range is limited to only an integer fraction of 360°, namely 180° for a quadrupole magnet, 120° for a six-pole magnet, and even less for a higher-order magnet.

SUMMARY OF THE INVENTION

It is an object of the present invention to provide an arrangement and a method and a sensor device for measuring an absolute angular position of a rotor with respect to a stator that is substantially insensitive to an unwanted external magnetic field ("Fremdfeld"), and has a measurement range of 360°.

This objective is accomplished by an arrangement and a method according to embodiments of the present invention.

In a first aspect, the present invention provides a magnetic sensor arrangement, comprising a magnet assembly and a magnetic sensor. The magnet assembly is arranged such that it forms a magnetic field having at least two magnetic field components with different angular periodicities at the location of the magnetic sensor, and the magnetic sensor includes means for sensing the different magnetic field components to produce at least a first and a second sensor element signal. The magnetic sensor arrangement further comprises a computing element for receiving the at least first and second signals and for combining them to produce a unique angular position of the magnet relative to the sensor.

It is an advantage of such a magnetic sensor arrangement that an angle in the full 360° range can be provided.

It is an advantage of embodiments of the present invention that the arrangement is highly insensitive (robust) against a constant external magnetic field.

In embodiments of the present invention, the magnet assembly may be a single magnet, meaning a contiguous element of magnetized material.

In embodiments of the present invention, the magnet assembly may have two or more magnetic poles of different magnitudes. The magnet assembly may have different sectors and the different magnitudes may be a result of the differential sector magnetization of the magnet assembly. In embodiments of the present invention, the differential sector magnetization may be a result of different sectors magnetization strength or different sectors areas, or a combination thereof.

In embodiments of the present invention, the magnet assembly can be or comprise a permanent magnet. In alternative embodiments, the magnet assembly can be an arrangement of coils, and a magnet controller. In the latter embodiments, the magnet assembly may have two or more magnetic poles of different magnitudes and the magnet controller may provide different voltages to the current to the coils to form the poles of different magnitudes.

In embodiments of the present invention, the magnetic sensor may comprise two or more sensor elements.

In embodiments of the present invention, the computing element may include a circuit for combining the first and second sensor element signals.

In a particular embodiment of the present invention, the magnetic sensor has a surface and two or more sensing elements, providing an electrical output and disposed at the surface of the magnetic sensor. The electrical output of the sensing elements may be linearly combined to produce the first at second signals. The magnetic field sensing elements may be sensitive to a magnetic field that is perpendicular to the surface, or parallel to the surface or a combination thereof.

In embodiments of the present invention, the computing element means do not include a Fourier transformation circuit.

In a second aspect, the present invention provides a method of determining a unique angular position of a magnet assembly relative to a sensor, the magnet assembly forming a magnetic field having at least two magnetic field components with different angular periodicities at the location of the magnetic sensor, and the magnetic sensor including means for sensing and a computing element. The method comprises the steps of: sensing the different magnetic field components to produce at least a first and a second sensor element signal using the means for sensing of the magnetic sensor, and receiving the at least first and second sensor element signals and combining them to produce said unique angular position using the computing means. At least one sensor may be used for sensing the at least a first and a second sensor element signals.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which:

FIG. 3 also shows an exemplary position of sensor elements of a prior art sensor device in a plane located at a distance from the magnet.

FIG. 13(a) and FIG. 13(c) are computer simulations for the axial field component "Bz" of the primary magnetic field "Bp" generated by the quadrupole of FIG. 10.

FIG. 13(b) and FIG. 13(d) are computer simulations for the axial field component "Bz" of the combined magnetic field including the primary magnetic field "Bp" generated by the quadrupole and the secondary magnetic field "Bs" generated by the dipole of FIG. 10.

FIG. 20(a) to FIG. 20(g) illustrate the impact of an external disturbance field on the secondary angle α2 determined in FIG. 18 and FIG. 19.

FIG. 25 to FIG. 30 illustrate several examples of sensor devices as can be used in embodiments of the present invention.

FIG. 25 shows a sensor device according to an embodiment of the present invention having eight primary sensor elements in the form of vertical Hall elements arranged on a first circle and oriented for measuring a radial field component "Br" in the XY plane, and optionally a plurality of at least two secondary sensors in the form of two additional Horizontal Hall elements arranged on a second circle for measuring a vertical field component "Bz" perpendicular to the XY plane.

FIG. 26 shows a sensor device according to an embodiment of the present invention having eight primary sensor elements in the form of vertical Hall elements arranged on a first circle and oriented for measuring a tangential field component "Bt" in the XY plane, and optionally a plurality of at least two secondary sensors in the form of Horizontal Hall elements arranged on a second circle for measuring a vertical field component "Bz" perpendicular to the XY plane.

FIG. 29 shows an embodiment of a sensor device according to the present invention, having eight pairs of horizontal Hall elements and further comprising Integrated Magnetic Concentrators (IMC) in the form of ring segments arranged above the first circle. This drawing is similar to FIG. 19 of WO'885, but the number of sensor elements and strips is different, and the algorithm for calculating the angle is different.

FIG. 30 shows a variant of the embodiment of FIG. 29, further comprising a plurality of at least two secondary Hall elements arranged on a second circle.

FIG. 31 to FIG. 59 illustrate several examples of magnets which can be used in embodiments of the present invention.

FIG. 32 and FIG. 33 show examples of a magnet having a central portion in the form of a 4-pole disk magnet, and an outer portion in the form of two ring segments magnetized in vertical direction (in the depth direction of the drawing).

FIG. 34 shows an example of an irregular 4-pole disk magnet, having four disk segments of constant thickness, but at least two disk segments having a different size.

FIG. 35 shows another example of an irregular four-pole disk magnet having an eccentric magnetization. This magnet would be mounted such that the geometric center of the magnet is located on the rotation axis of the rotor, but the magnetic "zero-point" is offset from said rotation axis.

FIG. 36 (top view) and FIG. 37 (perspective view) show a permanent magnet assembly which may be used in embodiments of the present invention, the magnet assembly being composed of four discrete cylindrical dipole magnets, two of a first size and two of a second size different from the first size, held together by a binding material such as epoxy or a polymer. The primary magnetic field is a quadrupole, the secondary magnetic field is the combination of two vertical dipoles.

FIG. 38 (top view) and FIG. 39 (perspective view) show a permanent magnet assembly which may be used in embodiments of the present invention, the magnet assembly being composed of four discrete cylindrical dipole magnets, three of a first size, one of a second size different from the first size. The primary magnetic field is a quadrupole, the secondary magnetic field is a single vertical dipole.

FIG. 40 is a top view of an irregular quadrupole which may be used in embodiments of the present invention, the quadrupole being in the form of a magnet assembly consisting of only four discrete cylindrical dipole magnets of the same size, all oriented in a same upright position (e.g. under 90° with respect to the plane of the sensor). Three dipoles are located on a circle having a center located on the rotation axis, but one of the dipoles is radially shifted inwards or outwards with respect to said circle.

FIG. 41 is a perspective view of an irregular quadrupole which may be used in embodiments of the present invention, the quadrupole being in the form of a magnet consisting of only four discrete cylindrical dipole magnets of the same size, all located on a circle having a center located on the rotation axis. Three dipoles are oriented parallel to the plane of the sensor, one of the dipoles is tilted under an angle in the range of 10° to 90° with respect to said direction normal to the sensor plane.

FIG. 42 (top view) shows a permanent magnet assembly which may be used in embodiments of the present invention, the magnet assembly being composed of six cylindrical dipole magnets, four (inner) cylindrical dipoles of a first size together forming a quadrupole, and two (outer) cylindrical dipoles of a second size generating a secondary magnetic field. The rotation axis lies exactly in the middle between the two dipoles.

FIG. 43 is a variant of the magnet assembly shown in FIG. 42, composed of the same cylindrical magnets, but the two outer magnets are not symmetrically aligned. Also this magnet assembly may be used in embodiments of the present invention.

FIG. 44 to FIG. 48 show several examples of magnets which may be used in embodiments of the present invention, the magnets having an inner portion in the form of a 4-pole ring magnet, and two outer segments in the form of ring segments.

FIG. 49 shows a magnet which may be used in embodiments of the present invention, the magnet comprising with an inner portion in the form of a 4-pole ring magnet, and two dipoles in the form of a beam, located outside of the ring magnet.

FIG. 50 to FIG. 55 are variants of the magnets shown in FIGS. 44 to 49, which may be used in embodiments of the present invention, the magnets having an outer portion in the form of a 4-pole ring magnet, and inner portions in the form of ring segments or beams for forming the secondary magnetic field which is rotation asymmetric.

FIG. 56 to FIG. 60 show several examples of magnet assemblies which may be used in embodiments of the present invention, and which are adapted for forming a rotation-symmetrical 6-pole (with 120° periodicity), and one or two or three vertical dipoles for forming the secondary magnetic field which is rotation asymmetric. These magnets are to be used in conjunction with a sensor device having twelve primary sensor elements (4 groups×3 elements/group).

Figure 1:
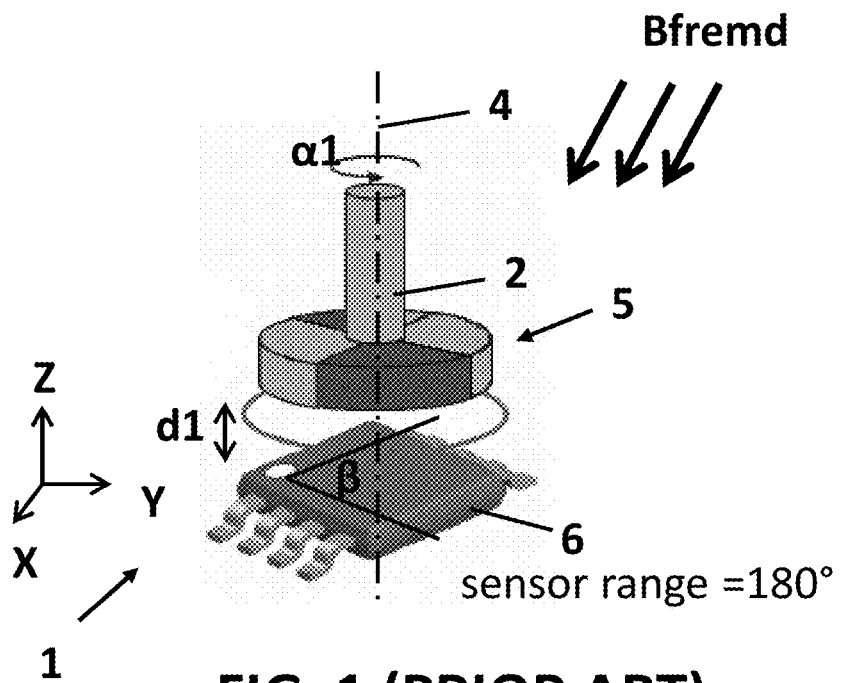
FIG. 1 is a copy of FIG. 2 of WO'885, and shows a prior art arrangement for absolute angular position measurement in a 180° range, using a four-pole disk magnet. Depending on the number of magnet poles, the number of sensor elements and the algorithm being used, this sensor arrangement is highly insensitive for a constant external disturbance field.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, directional terminology such as top, bottom, front, back, leading, trailing, under, over and the like in the description and the claims is used for descriptive purposes with reference to the orientation of the drawings being described, and not necessarily for describing relative positions. Because components of embodiments of the present invention can be positioned in a number of different orientations, the directional terminology is used for purposes of illustration only, and is in no way intended to be limiting, unless otherwise indicated. It is, hence, to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

When reference is made to "external magnetic field", or "unwanted field" or "disturbance field" or "Fremdfeld" or "Strayfield", the magnetic field other than that caused by the magnet of the magnetic sensor arrangement, is meant.

With a "rotation symmetrical field with respect to the rotation axis" is meant that the magnetic field looks the same after the field is rotated about said rotation axis over an angle equal to an integer fraction of 360° known as the periodicity, in particular 180° in case of a 4-pole magnet, 120° in case of a 6-pole magnet, etc.

With a "rotation asymmetrical field with respect to the rotation axis" is meant that the field is not rotation-symmetric with respect to said rotation axis, meaning that the periodicity is 360°.

With a "constant external field" or "uniform external field" is meant a field with a constant amplitude and a constant direction. Such a field can be described as a constant vector (Bxo, Byo, Bzo).

With a "field having a constant gradient" is meant a field having an amplitude which varies linearly with distance. Such a field can be described by (Bx0+ GradX*x, By0+ GradY*y, Bz0+ GradZ*z), where Bxo, Byo, Bzo, GradX, GradY and GradZ are constants, and x, y, z are coordinates.

In this application the terms "magnet" or "magnet assembly" or "magnet structure" are used as synonyms. The magnet can be a permanent magnet, or alternatively an arrangement of coils and a magnet controller.

In this application the term "regular disk-magnet" means a disk magnet such as the one shown in FIG. 1, where each disk segment has the same thickness, is made of the same material, defines segments of the same angle (90° in case of a 4-pole, 60° in case of a six-pole), the center of the magnetization coinciding with the geometrical center of the disk, etc).

A similar definition can be given for a "regular ring magnet", where the magnet then does not have a disk-shape but is ring-shaped.

In this application the term "irregular disk-magnet" means a disk magnet having at least one irregularity, e.g. a non-constant thickness, and/or the segments defining different angles, and/or the center of magnetization not coinciding with the geometrical center of the disk, etc.

Where in this application reference is made to "algorithm2" or the "second algorithm", reference is made to formula [2] (see further), or in case of a magnet with a quadrupole, the set of formulas [3] to [10] or the set of formulas [11] to [14] or the set of formulas [15] to [16], or equivalent formulas.

In this document the terms "quadrupole" or "four-pole" or "4-pole" or "multi-pole with four poles" are used as synonyms.

In this document the terms "XY plane" and "sensor plane" and "plane defined by the first circle" are used as synonyms.

The present invention is a further improvement of what is disclosed in WO'885(A1), filed by the same applicant as the present invention, which is considered the closest prior art. A good understanding of this disclosure is crucial for fully understanding and appreciating the present invention. The entire document of WO'885 is incorporated herein by reference. For jurisdictions where such incorporation is not allowed, a summary of that disclosure is deemed sufficient. The interested reader can consult WO'885 for more information, should that be necessary.

FIG. 1 shows a prior art arrangement 1 for absolute angular position measurement in a 180° range. The arrangement 1 comprises a four-pole disk magnet 5 and a sensor device 6 comprising a plurality of sensor elements arranged on a circle, in a constant external field Bfremd. This drawing is a copy of FIG. 2 of WO'885, in which document two algorithms are described for determining the angular position, referred to as "algorithm1" and "algorithm2". In short, algorithm1 boils down to the formula:

$$\arctan(\Sigma(Si)/\Sigma(Ti)) \quad [1],$$

and algorithm2 boils down to the formula:

$$\arctan((\Sigma(Si)-\Sigma(Ui))/(\Sigma(Ti)-\Sigma(Vi))) \quad [2],$$

where Si, Ti, Ui, Vi represent the signals obtained from sensor elements having a specific geometric relationship, as described in WO'885. Formula [2] is also referred to herein as the "arctan of the ratio of the differences of the sums".

Although the present invention is not limited to a quadrupole and to a sensor having eight sensor elements, most examples described below are related to a quadrupole, in order to provide a better understanding.

In case the magnet 5 of FIG. 1 is a regular quadrupole, the "second algorithm" can also be expressed by the following set of equations:

$$\text{sum1}=S1+S2 \quad [3]$$

$$\text{sum2}=T1+T2 \quad [4]$$

$$\text{sum3}=U1+U2 \quad [5]$$

$$\text{sum4}=V1+V2 \quad [6]$$

$$\text{diff1}=\text{sum1}-\text{sum3} \quad [7]$$

$$\text{diff2}=\text{sum2}-\text{sum4} \quad [8]$$

$$R=\text{diff1}/\text{diff2} \quad [9]$$

$$\alpha1=(\arctan R)/2 \quad [10]$$

or by the following set of equations:

$$\text{diff1}=(S1+S2)-(U1+U2) \quad [11]$$

$$\text{diff2}=(T1+T2)-(V1+V2) \quad [12]$$

$$R=\text{diff1}/\text{diff2} \quad [13]$$

$$\alpha1=(\arctan R)/2 \quad [14]$$

or by any other equivalent set of equations, for example:

$$R=(U1+U2-S1-S2)/(V1+V2-T1-T2) \quad [15]$$

$$\alpha 1=(\arctan R)/2 \quad [16]$$

Still referring to FIG. 1, depending on the number of magnet poles, the number of sensor elements and the "first or second algorithm" being used (corresponding to formula [1] and [2] respectively), the prior art sensor device 6 can determine an angular position α1 of the magnet with respect to the sensor device, and thus of the rotor with respect to the stator, by measuring the magnetic field generated by the four-pole magnet. This determination is highly insensitive against a uniform external disturbance field. Reference is made in this respect to Table 1 of WO'885, showing an overview of the most important features of such an arrangement.

In the present invention only the "second algorithm" (i.e. algorithm2) will be used, but in order to avoid confusion, it will still be referred to herein as "the second algorithm", even though it is the only algorithm used in the present invention to calculate the primary angle α1, or more precisely: methods according to the present invention will use this "second algorithm" as one of the steps (step 172 in FIG. 17), but further steps will be added.

Figure 2:
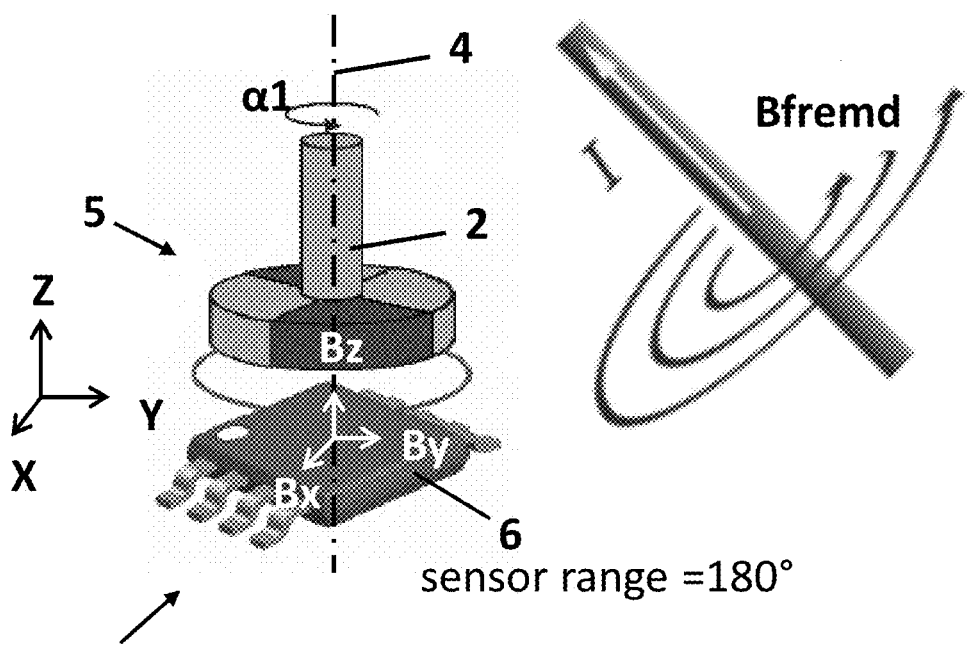
FIG. 2 is a copy of FIG. 24 of WO'885, and shows a prior art arrangement similar to that of FIG. 1, but instead of the constant external field, an external field caused by a current conducting wire is shown. Depending on the number of magnet poles, the number of sensor elements and the algorithm being used, the sensor is also insensitive for an external disturbance field having a field gradient. The measurement range of this prior art sensor is also 180°.

FIG. 2 shows a prior art arrangement 1 similar to that of FIG. 1, but instead of the constant external field, an external field Bfremd caused by a current conducting wire, is shown. Depending on the number of magnet poles, the number of sensor elements and the algorithm being used, the prior art sensor device 6 is also insensitive for an external disturbance field with a field gradient (i.e. having an amplitude which varies with distance). This drawing is a copy of FIG. 24 of WO'885. The measurement range of this prior art sensor device 6 is 180°.

Figure 3:
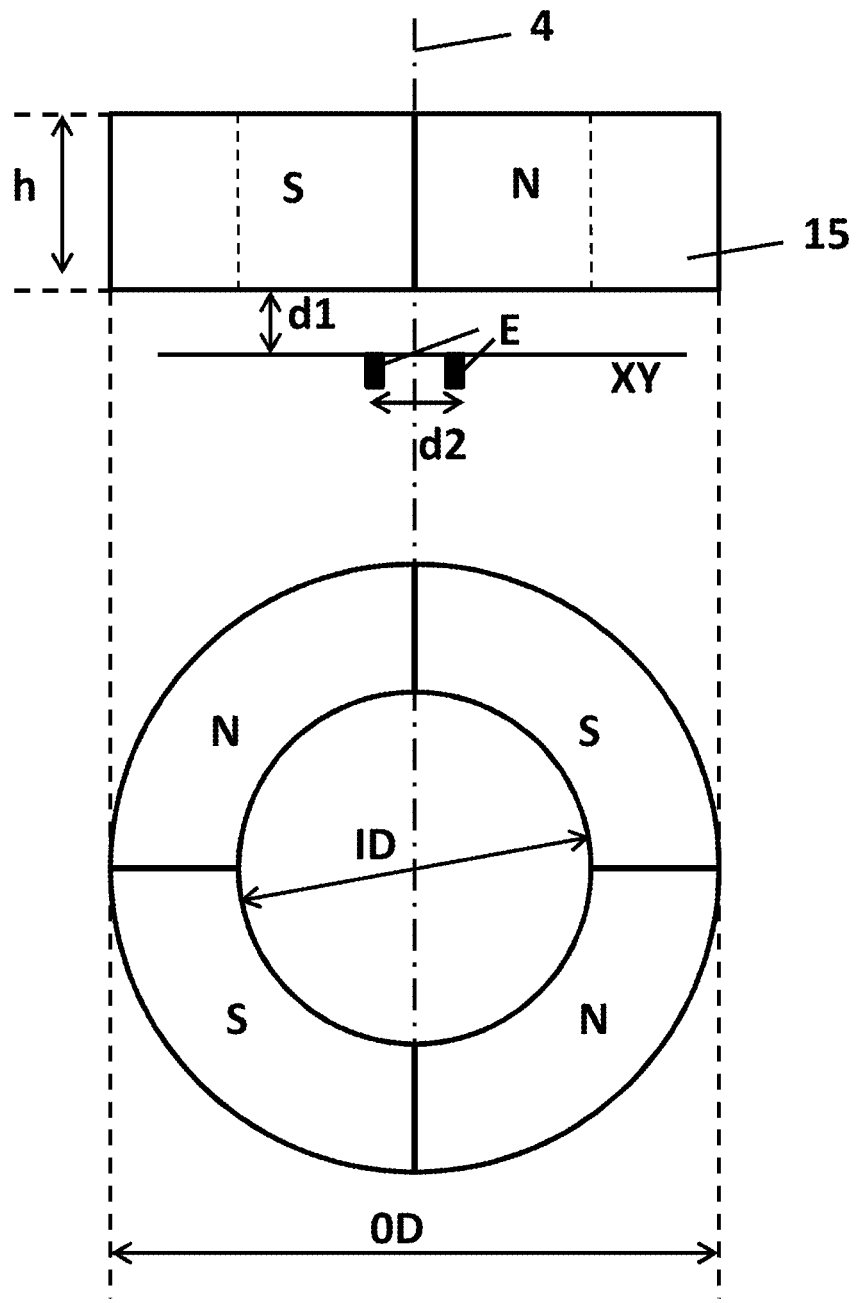
FIG. 3 is a copy of FIG. 6 of WO'885, and shows an example of a four-pole ring-magnet with a central opening, shown in top-view (bottom of FIG. 3) and in side-view (top of FIG. 3).

FIG. 3 shows an example of a prior art arrangement comprising a regular four-pole ring-magnet 15 having a central opening, shown in top-view (bottom of FIG. 3) and in side-view (top of FIG. 3), and a sensor device having a plurality of sensor elements "E" located on a circle in a plane XY at a distance d1 from the magnet 15. This is a copy of FIG. 6 of WO'885.

Figure 4:
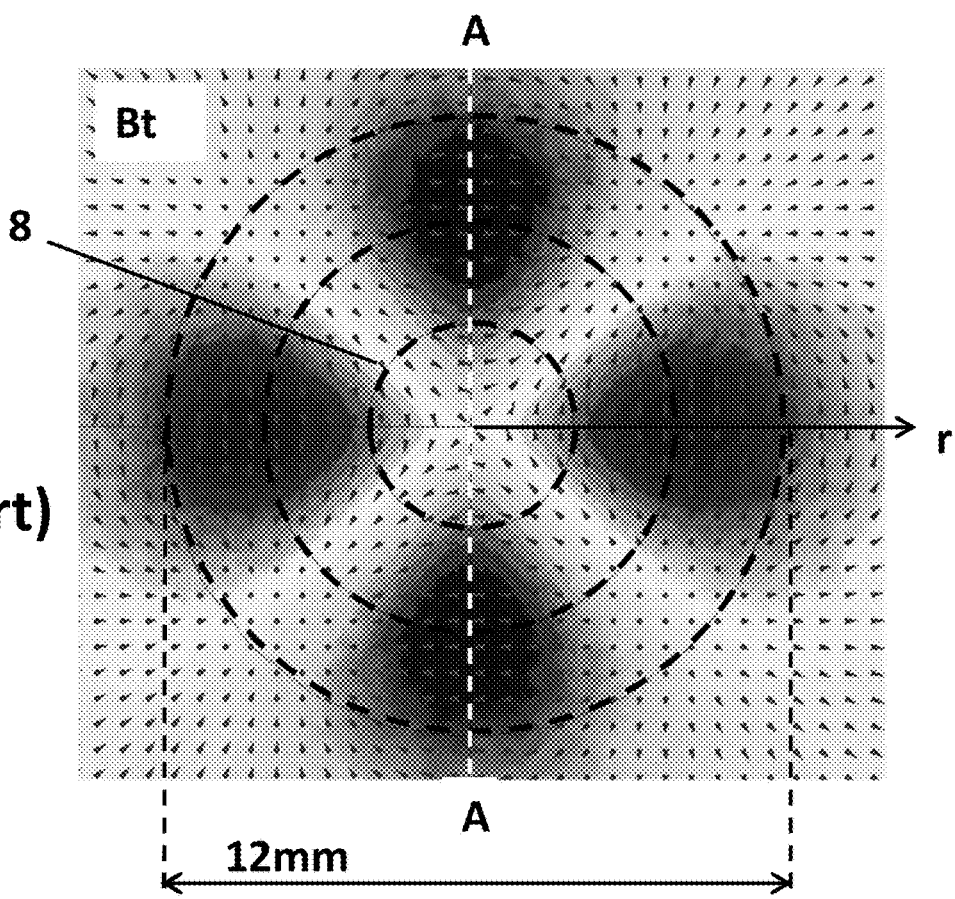
FIG. 4 is a copy of FIG. 7 of WO'885, and shows a simulation of the tangential field component "Bt" of the four-pole ring magnet of FIG. 3 at a distance of 3 mm below the magnet surface. The outer and middle circles correspond to the outer diameter and inner diameter of the ring magnet. The inner circle corresponds to an imaginary circle where the sensor elements are placed.

FIG. 4 shows a simulation of the tangential field component "Bt" of the four-pole ring magnet 15 of FIG. 3 at a distance of 3 mm below the magnet surface. The outer and middle circles correspond to the outer diameter and inner diameter of the ring magnet 15. The inner circle corresponds to an imaginary circle where the sensor elements E are placed. This is a copy of FIG. 7 of WO'885. Although not shown, the tangential field component "Bt" measured at different positions on the circle 8 varies in a sinusoidal manner.

Figure 5:
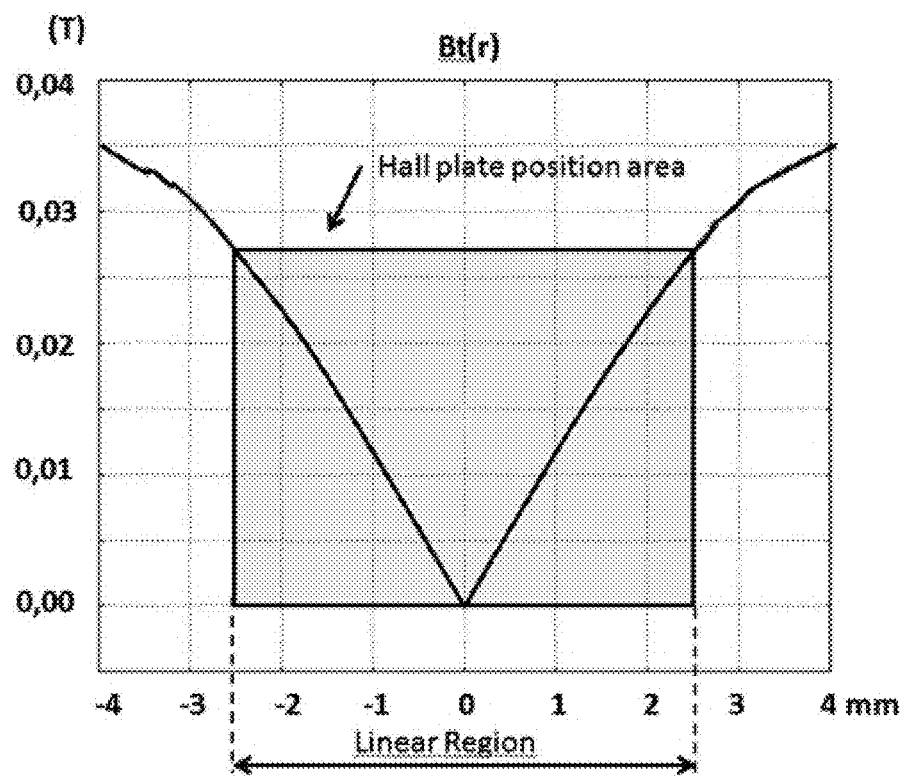
FIG. 5 is a copy of FIG. 15 of WO'885, and shows the strength of the tangential magnetic field component "Bt" of FIG. 4 as a function of the radius (as can be measured on line A-A).

FIG. 5 shows the strength of the tangential magnetic field component "Bt" of FIG. 4 as a function of the radius r of the circle 8 upon which the sensor elements E are located. This drawing is a copy of FIG. 15 of WO'885. This drawing is useful to explain that a sensor adapted for measuring the tangential field Bt is highly insensitive to position errors. It also shows that the signal amplitude of "Bt" decreases as the radius 8 decreases, which means that a sensor device capable of measuring the tangential field can (in principle) be shrinked to a very small size. And indeed, for the envisioned sensor devices, the radius on which the sensor elements are located preferably lies in the range of 100 micron to 2500 micron, for example in the range from 200 micron to 2500 micron.

Figure 6:
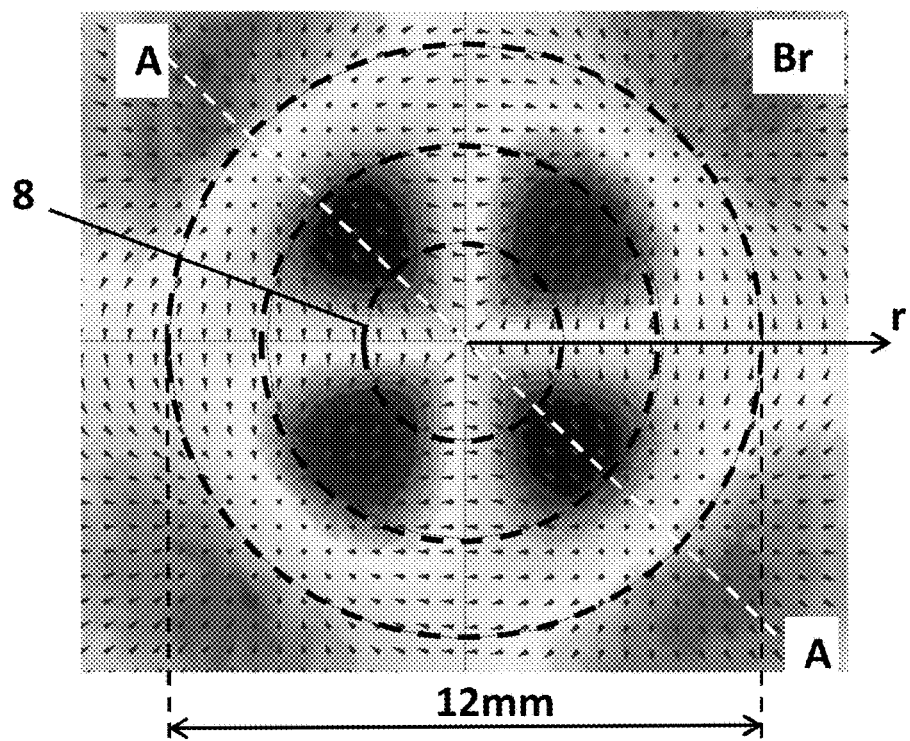
FIG. 6 is a copy of FIG. 9 of WO'885, and shows a simulation of the radial field component "Br" of the four-pole ring magnet of FIG. 3 at a distance of 3 mm below the magnet surface. The same rings as in FIG. 4 are shown.

FIG. 6 shows a simulation of the radial field component "Br" of the four-pole ring magnet of FIG. 3 at a distance of 3 mm below the magnet surface. The same rings as in FIG. 4 are shown. This is a copy of FIG. 9 of WO'885. Although not shown, the radial field component "Br" measured at different positions on the circle 8 varies in a sinusoidal manner.

Figure 7:
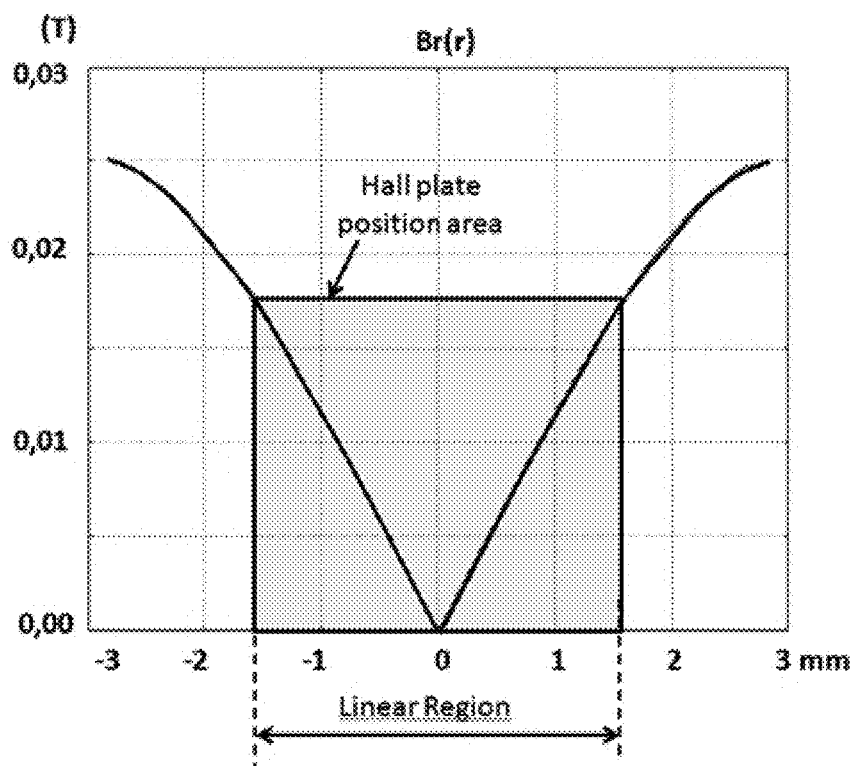
FIG. 7 is a copy of FIG. 14 of WO'885, and shows the strength of the radial magnetic field component "Br" of FIG. 6 as a function of the radius (as can be measured on line A-A).

FIG. 7 shows the strength of the radial magnetic field component "Br" of FIG. 6 as a function of the radius of the circle 8 upon which the sensor elements E are located. This is a copy of FIG. 14 of WO'885. This drawing is useful to explain that a sensor adapted for measuring the radial field Br is also highly insensitive to position errors. It also shows that the signal amplitude of "Br" decreases as the radius 8 decreases, hence, also this device can (in principle) be shrinked to a very small size.

Figure 8:
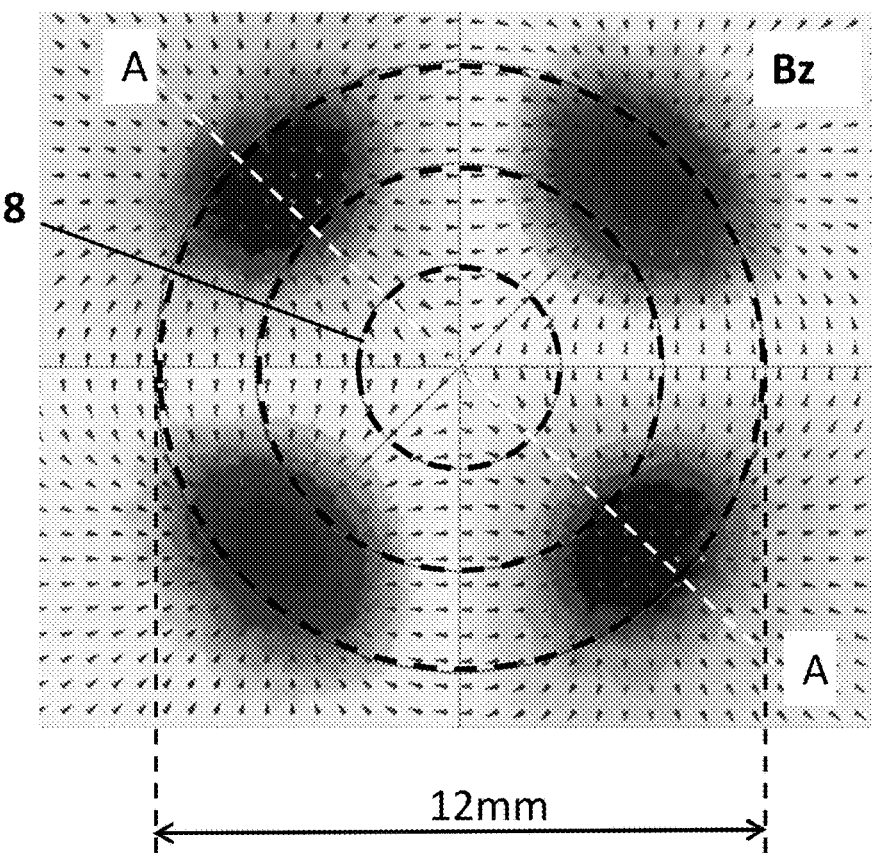
FIG. 8 is a copy of FIG. 11 of WO'885, and shows a simulation of the axial field component "Bz" of the four-pole ring magnet of FIG. 3 at a distance of 3 mm below the magnet surface. The same rings as in FIG. 4 are shown.

FIG. 8 shows a simulation of the axial field component "Bz" of the four-pole ring magnet of FIG. 3 at a distance of 3 mm below the magnet surface. The same rings as in FIG. 4 are shown. This is a copy of FIG. 11 of WO'885. Although not shown, the axial field component "Bz" measured at different positions on the circle 8 varies in a sinusoidal manner.

Figure 9:
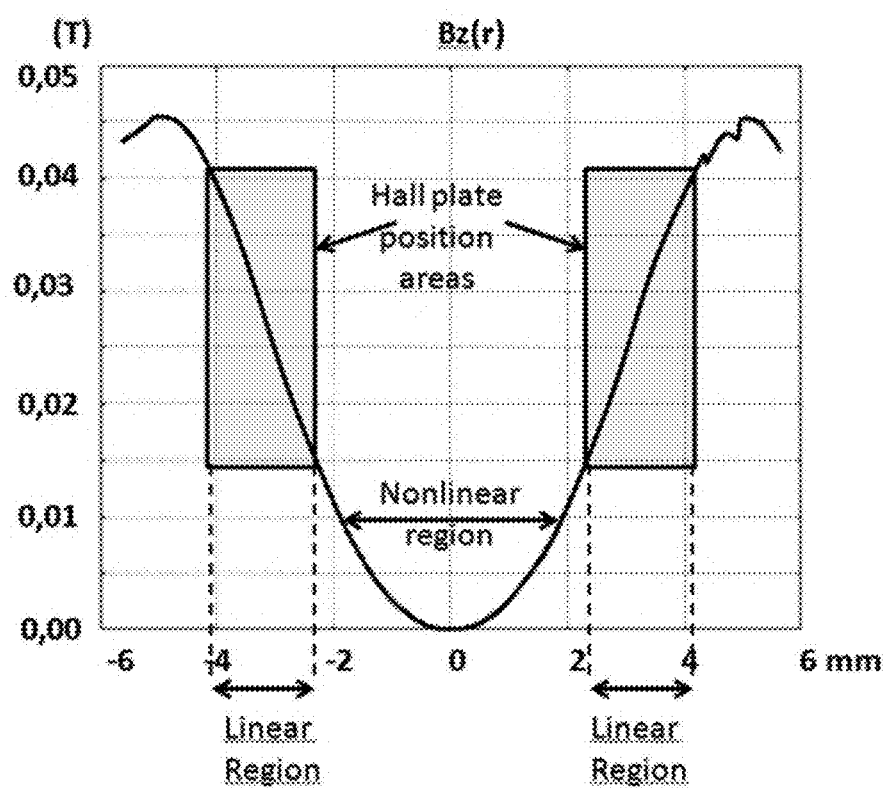
FIG. 9 is a copy of FIG. 13 of WO'885, and shows the strength of the axial magnetic field component of FIG. 8 as a function of the radius (as can be measured on line A-A).

FIG. 9 shows the strength of the axial magnetic field component "Bz" of FIG. 8 as a function of the radius of the circle 8 upon which the sensor elements E are located. This is a copy of FIG. 13 of WO'885. As shown, the signal amplitude does not vary linearly with the radius. This plot shows that such a sensor is more sensitive to position errors.

Even though the sensor arrangement described in WO'885 and illustrated in FIG. 1 to FIG. 9 has very advantageous features, in particular: high sensitivity, no or low sensibility to position-offset errors, no or low sensitivity to a uniform external field (Fremdfeld), and low sensitivity to an external field with a field gradient, it has one major disadvantage: its measurement range is limited, to only 180° for a quadrupole magnet assembly, 120° for a six-pole magnet assembly, etc.; in general to 360°/(N/2) for a magnet arrangement with N magnet poles.

The inventors of the present invention were confronted with the problem of finding a way to allow measurement of an angle over a complete 360° range, without losing all the advantages provided by the previous invention. They surprisingly came to the idea of no longer considering the external field as a problem, namely a field that needed to be "filtered away" so that it would not be measured. They decided, quite opposite to the previous invention, to deliberately introduce a secondary magnetic field "Bs" which is not rotation symmetric with respect to the rotor axis, and to use this secondary magnetic field "Bs" to resolve the angular uncertainty (i.e. whether or not 180° should be added in case a quadrupole magnet assembly is used, whether 0° or 120° or 240° should be added in case of a six-pole magnet assembly, etc; or in general whether 360°/(N/2 k) should be added to the measurement in case of an N-pole magnet assembly, with k an integer). This is one of the underlying ideas of the present invention.

Figure 10:
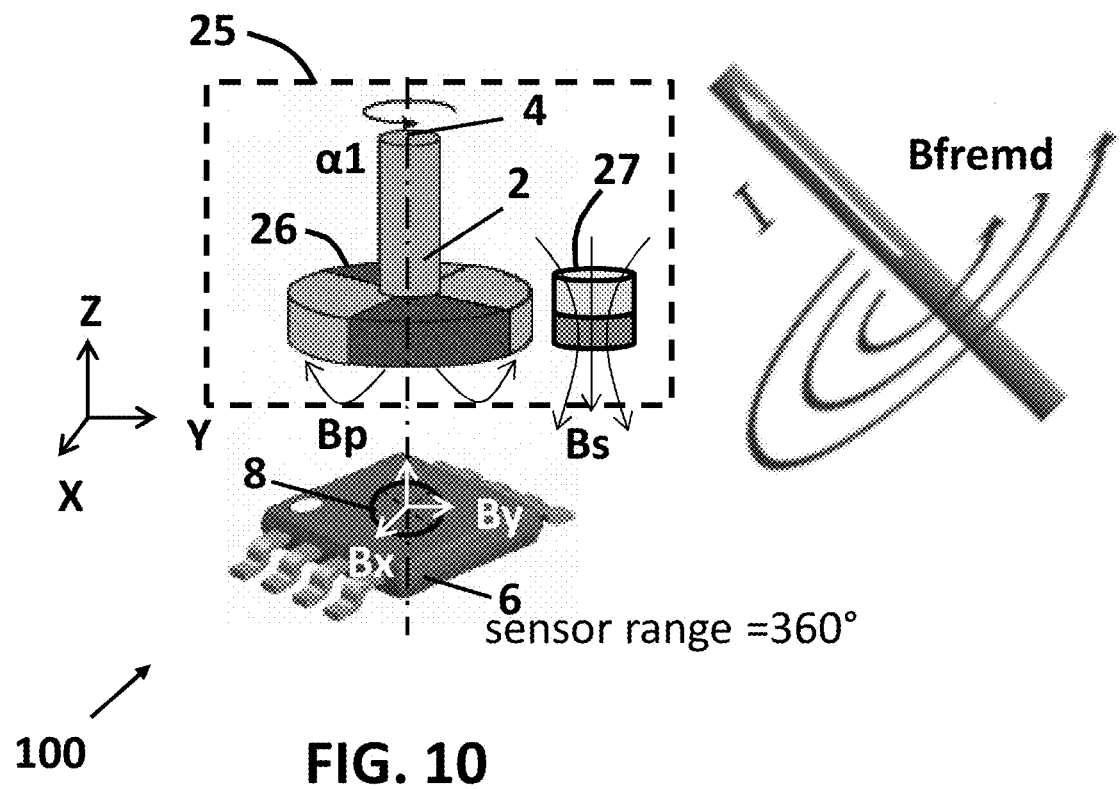
FIG. 10 shows an arrangement according to a first embodiment of the present invention. It comprises a magnet composed of a quadrupole and a single dipole, and a sensor device comprising a plurality of primary sensor elements arranged on a first circle. The field generated by the quadrupole is referred to as the primary magnetic field "Bp". The field generated by the dipole is referred to as the secondary magnetic field "Bs".

FIG. 10 shows an arrangement 100 as a first embodiment of the present invention. The arrangement 100 comprises a magnet assembly 25 and a sensor device 6. The magnet assembly 25 forms a magnetic field having at least two magnetic field components with different angular periodicities at the location of the sensor device 6. In the embodiment illustrated, the magnet assembly 25 comprises a regular quadrupole 26 and a single cylindrical dipole 27 fixedly connected together in any suitable manner, for example by means of epoxy or a polymer (not shown). As shown, the rotation axis 4 of the rotor 2 passes through the center of the quadrupole 26, and through the center of a circle 8 upon which the sensor elements are located. For reasons that will become clear later, the circle 8 upon which the sensor elements, in the example illustrated eight sensor elements, are located is called "first circle", and the sensor elements located on the first circle, in the example illustrated at 45° degrees angular distance, are referred to as "primary sensor elements".

The magnetic field generated by the quadrupole 26, is referred to as "primary magnetic field". This field is rotation symmetric with respect to the rotation axis 4 having a periodicity of 180°, and the primary sensor elements are used in exactly the same way as in WO'855 (using the "second algorithm") to calculate an angle α1 in the range from 0° to 180°, referred to herein as "primary angle".

But, in contrast to the prior art, the magnetic field seen by the sensor device 6 is not only the field generated by the quadrupole 26, but the superposition of this primary magnetic field "Bp" with a secondary magnetic field "Bs" created by the cylindrical dipole 27, which is not rotation symmetric about the rotation axis 4, because the dipole 27 is mounted eccentrically.

Figure 11:
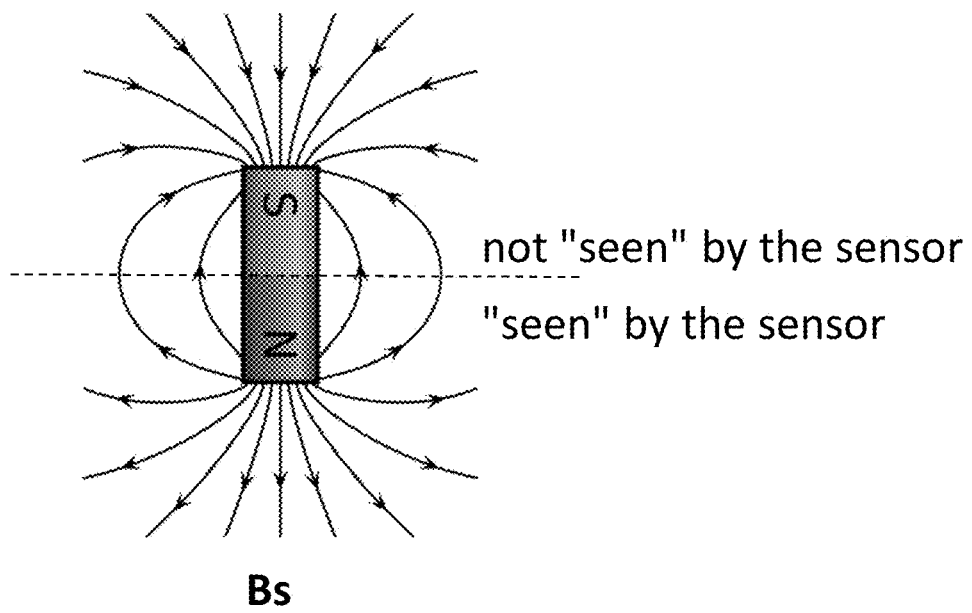
FIG. 11 shows a typical example of the magnetic field generated by a single cylindrical dipole. The lower part of this field is the field "seen" by the sensor elements.

FIG. 11 shows a typical example of the magnetic field generated by a single cylindrical dipole, known per se in the art. The lower part of this field is the field "seen" by the sensor elements.

FIG. 12 to FIG. 14 will be used to illustrate that this secondary magnetic field "Bs" is largely (although not completely) "filtered out" by the primary sensor elements on the first circle 8, in conjunction with algorithm2, hence does not significantly influence the measurement of the primary angle α1.

Figure 12A:
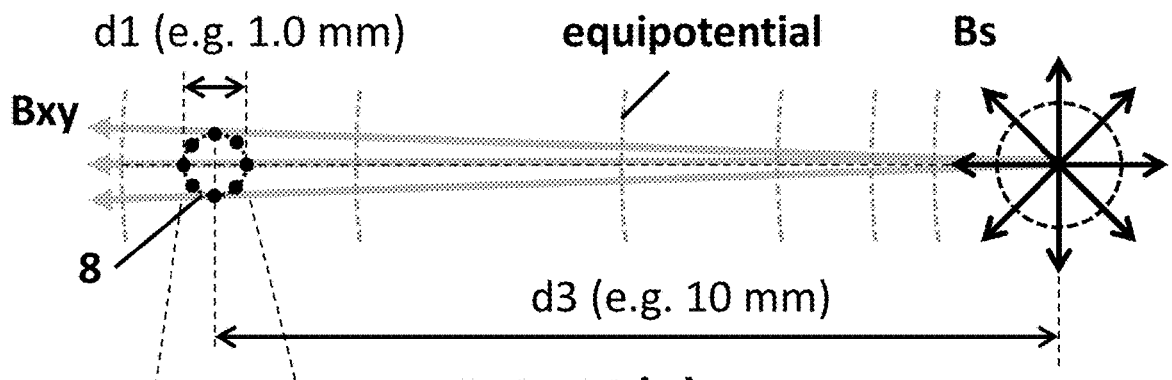
FIG. 12(a) shows an enlarged view of the first circle with the primary sensor elements and illustrates the field lines in the XY plane of the secondary magnetic field "Bs" generated by the cylindrical dipole of FIG. 10. It also shows typical relative dimensions of the radius with the sensor elements, and the distance from the dipole.

FIG. 12(a) shows (on the left hand side) a top view of the "first circle" 8 with the "primary sensor elements" (indicated as black dots) and the secondary magnetic field "Bs" generated by the cylindrical dipole 27 of FIG. 10 in enlarged view. The arrows represent field lines of the secondary magnetic field Bs in the XY plane, the dashed circle segments indicate equipotential planes of the secondary field Bs in the XY plane. As is known in the art, the field lines of the dipole 27 of FIG. 11 in a plane XY perpendicular to the longitudinal axis of the dipole 27 are radially oriented, and the magnetic amplitude decreases with increasing distance from the dipole 27.

Figure 12B:
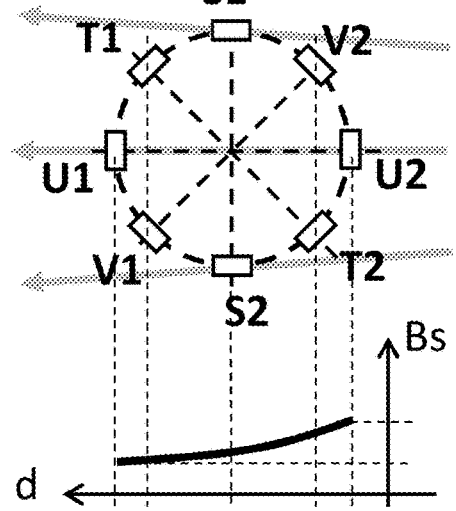
FIG. 12(b) shows a typical magnitude curve of the secondary magnetic field "Bs" generated by the dipole as a function of distance.

FIG. 12(b) shows a typical magnitude curve of the radial "Br" and tangential "Bt" components of the secondary magnetic field "Bs" generated by the dipole 27, measured at locations in the XY plane.

Figure 12C:
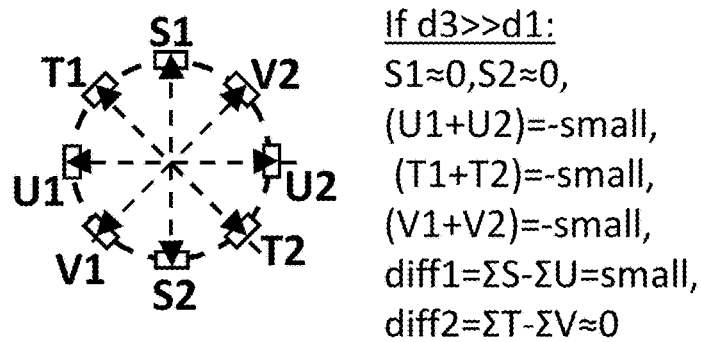
FIG. 12(c) and FIG. 12(d) show the impact of this secondary magnetic field Bs on the sums and differences of the primary signals measured by vertical Hall elements oriented radially or tangentially, respectively.
Figure 12D:
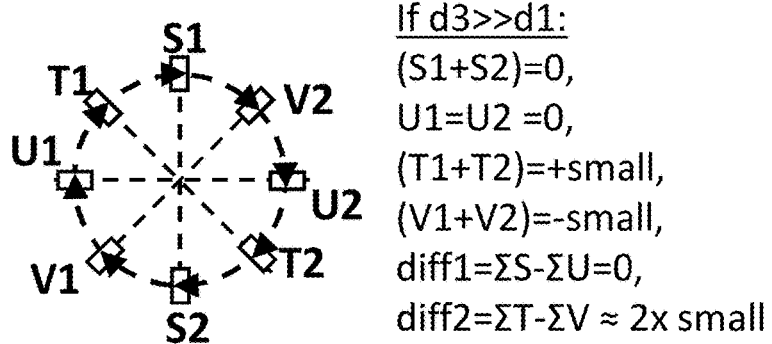

FIG. 12(c) and FIG. 12(d) show the impact of this secondary magnetic field Bs on the sums and differences of the primary signals measured by vertical Hall elements oriented tangentially or radially, respectively.

As can be seen, at least some of the sums and differences are not exactly equal to zero, hence, the secondary magnetic field Bs generated by the dipole will influence the measurement of the primary angle α1, but when taking into account the (relative small) dimensions of the first circle 8 and the (relatively large) distance between the sensor elements and the longitudinal axis of cylindrical dipole 27, and when considering the field lines of the dipole 27, it can be understood that the influence is in fact very small, causing an error on the primary angle α1 estimated to be smaller than 0.5 degree, for example in the order of 0.1 degree if the largest ratio of Bs/Bp (as can be measured by the sensor elements) is at least a factor 50, preferably at least a factor 100. This error can be further reduced by decreasing the radius of the circle 8 and/or by decreasing the field strength of the secondary magnetic field Bs (generated by the dipole 27) with respect to the primary magnetic field Bp (generated by the quadrupole 26), and/or by increasing the distance between the rotation axis 4 and the longitudinal axis of the dipole 27.

However, not all applications require an angular precision of 0.5°, and for applications where an angular position error of for example about 1° to 2° is allowed, the ratio d3/d1 of distance between the sensor elements and the longitudinal axis of cylindrical dipole 27 to diameter of the first circle 8 can be chosen appropriately, for example smaller than a factor 10.0, for example a factor in the range from 3.0 to 9.0, for example about 8.0 or about 6.0 or about 4.0.

FIG. 13(a) is an intensity plot obtained by computer simulation of the axial field component "Bz" of the primary magnetic field "Bp" generated by a regular quadrupole 5 of FIG. 1 (taken alone, i.e. without the presence of a cylindrical dipole as in FIG. 10). The location of the sensor elements on the first circle 8 is indicated by "+" signs.

FIG. 13(c) shows field lines corresponding to the intensity field of FIG. 13(a). As can be appreciated, the primary magnetic field Bp is rotation symmetrical about the rotation axis (in the center) with a periodicity of 180° (not 90° as the black and white drawings might falsely suggest).

FIG. 13(b) is an exemplary intensity plot of the axial field component "Bz" of the magnetic field generated by the permanent magnet assembly 25 of FIG. 10, being the superposition of the primary magnetic field "Bp" generated by the quadrupole 26 and the secondary magnetic field "Bs" generated by the vertically installed cylindrical dipole 27. As can be seen, this combined field (Bp and Bs) is completely different from that shown in FIG. 13(a), and is not rotation symmetrical about the rotation axis 4 (in the center of the first circle).

FIG. 13(d) shows field lines corresponding to the intensity field of FIG. 13(b). As can be seen these field lines are completely different from those shown in FIG. 13(c).

Figure 14A:
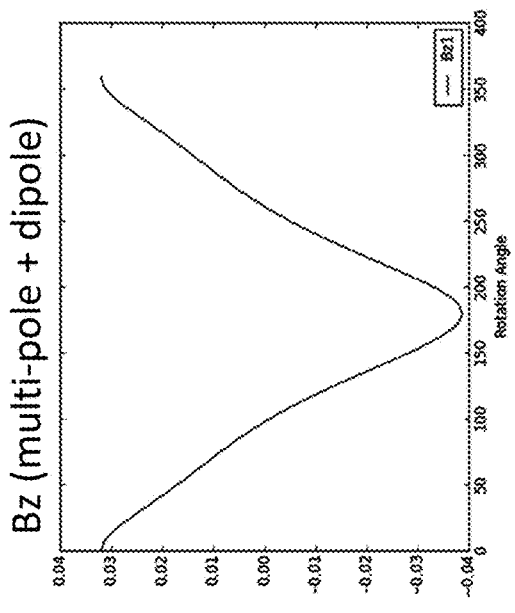
FIG. 14(a) shows an example of the "Bz" signal of the axial field component of the primary magnetic field "Bp" of FIG. 13(a) generated by the quadrupole.

FIG. 14(a) shows a signal corresponding to the axial field component "Bz" of the primary magnetic field Bp shown in FIG. 13(a) generated by the multi-pole magnet 5, as would be measured by an individual primary sensor element on the first circle 8 in the absence of the cylindrical dipole 27 as illustrated in FIG. 10. The other primary sensor elements would measure exactly the same signal, but phase shifted by integer multiples of 45° (in case of 8 primary sensors being present). As can be seen this is a sinusoidal signal having a periodicity of 180° (in case of the magnet assembly 5 being a quadrupole).

Figure 14B:
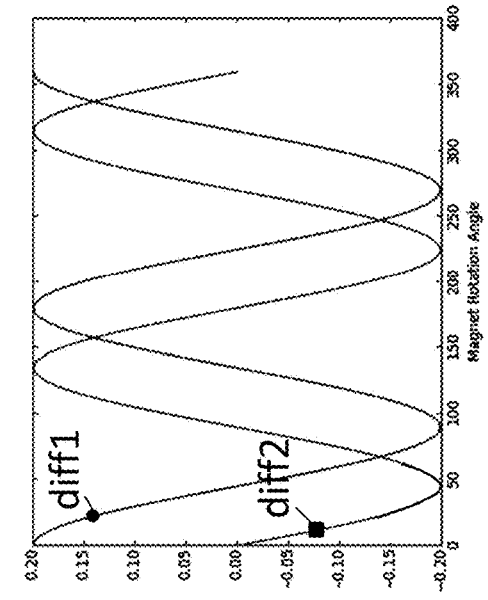
FIG. 14(b) shows an example of the "Bz" signal of the axial field component of the combined primary and secondary magnetic field of FIG. 13(c).
Figure 14C:
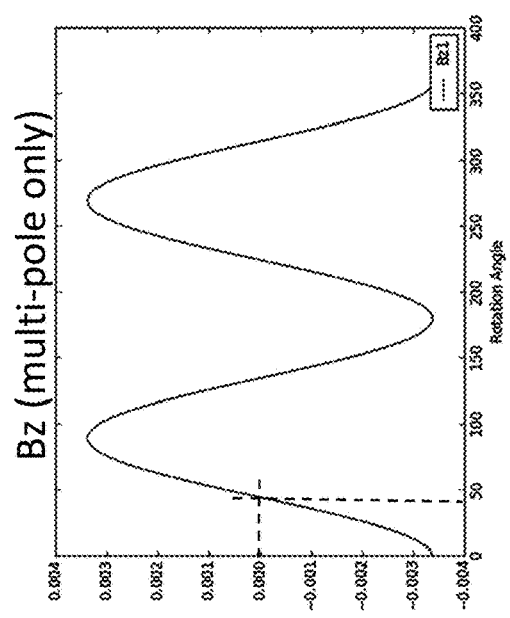
FIG. 14(c) shows a first and a second difference signal "diff1" and "diff2", as can be obtained by summing and subtracting signals like the one shown in FIG. 14(a) and phase-shifted versions thereof, using specific formulas.

FIG. 14(c) shows the first and a second difference signal "diff1" and "diff2" according to formula [11] and [12] described above, using signals like that of FIG. 14(a) and phase-shifted versions hereof (only one signal is shown). As can be seen, under the same circumstance as the ones of FIG. 14(a), these difference signals are sinusoidal signals having a periodicity of 180°.

FIG. 14(b) shows the signal corresponding to the axial field component "Bz" of the magnetic field shown in FIG. 13(c), as would be measured by an individual primary sensor element in the presence of the combined field being the superposition of the primary magnetic field Bp due to the multi-pole, e.g. quadrupole 26, and the secondary magnetic field Bs due to the dipole 27. As can be seen, this signal does not have a periodicity of 180°.

Figure 14D:
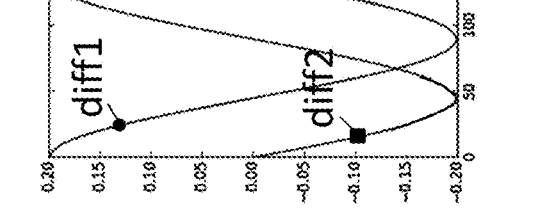
FIG. 14(d) shows the first and second difference signal "diff1" and "diff2", based on the signal of FIG. 14(b) and phase-shifted versions thereof.

FIG. 14(d) shows the first and a second difference signal "diff1" and "diff2", according to formula [11] and [12] described above, using signals like that of FIG. 14(b) and phase-shifted versions hereof (only one signal is shown), as would be measured by the other sensor elements.

As can be seen these difference signals diff1, diff2 are nearly identical to those of FIG. 14(c). Thus the arctan function of the ratio of diff1 and diff2 will give nearly the same result for FIG. 14(c) without dipole being present, and FIG. 14(d) with dipole 27 being present. This demonstrates that the sensor device 6 having eight primary sensor elements when used with the second algorithm called "second algorithm", is highly insensitive to the Bz field generated by the dipole 27.

Figure 15:
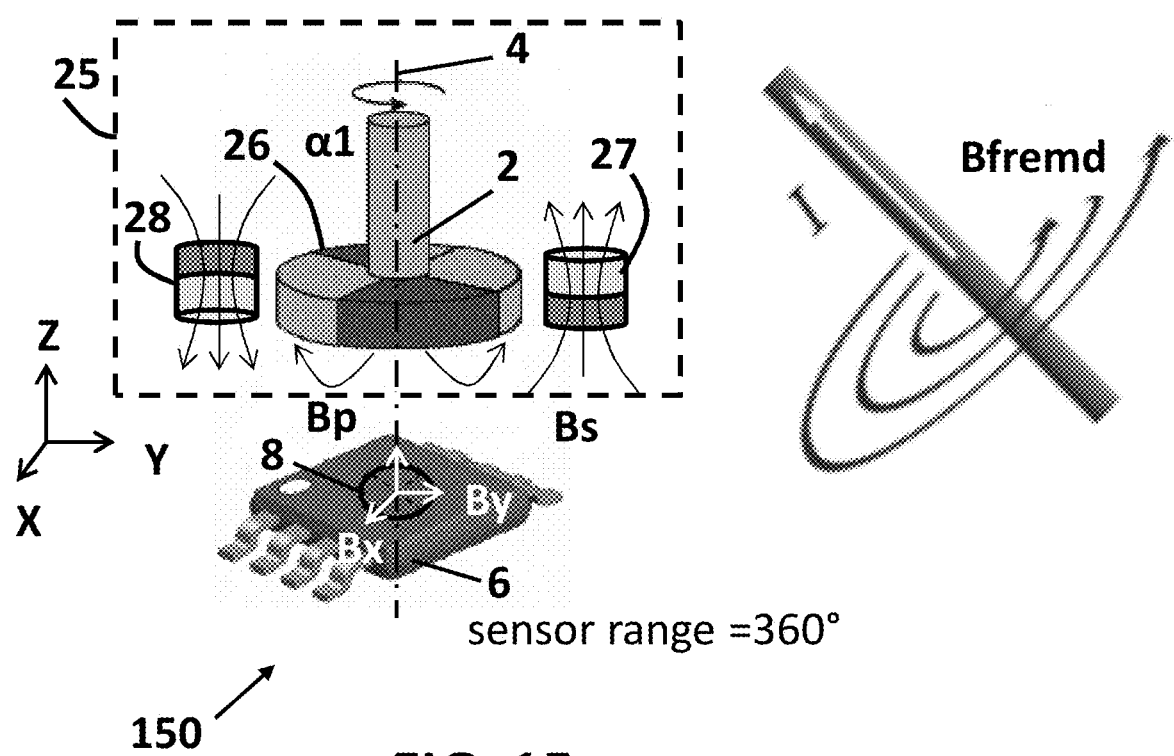
FIG. 15 shows a second arrangement as a second embodiment of the present invention. This arrangement comprises a permanent magnet composed of a quadrupole and two identical cylindrical dipoles located on opposite sides of the rotation axis, at a same distance from the rotation axis, and oriented in opposite directions.
Figure 24:
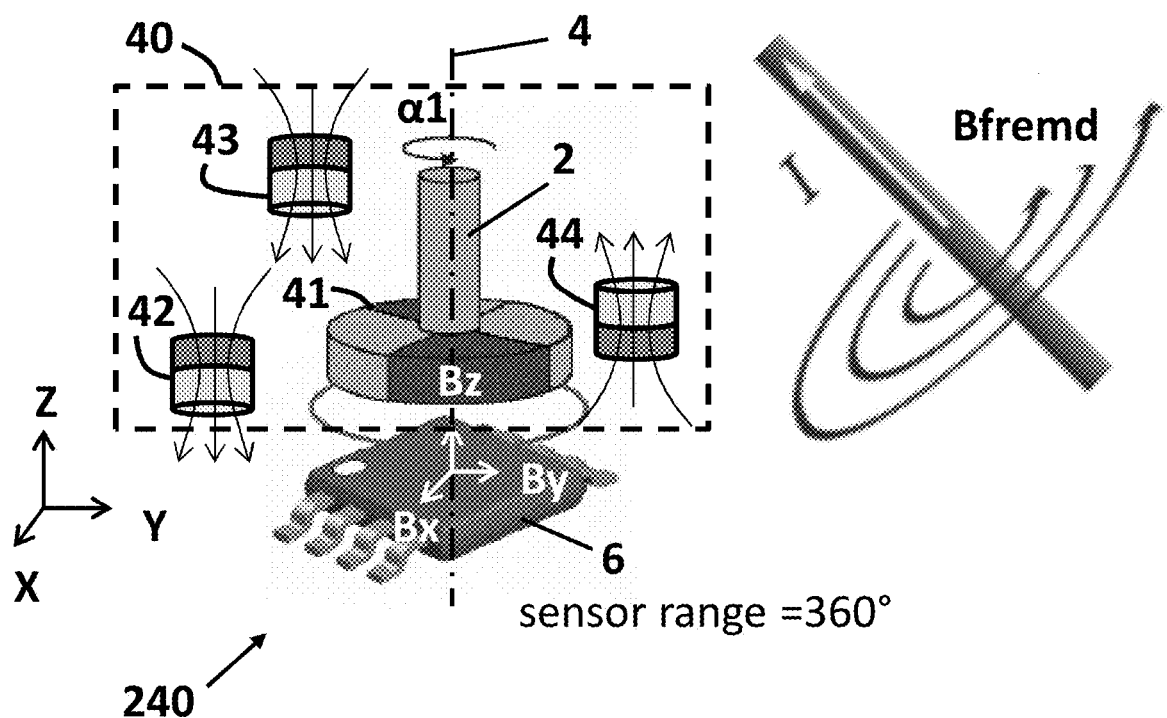
FIG. 24 shows another exemplary arrangement as a third embodiment of the present invention. This arrangement comprises a permanent magnet composed of a quadrupole and three identical cylindrical dipoles, at least two of which are oriented in different directions.

Before describing how the secondary magnetic field Bs can be used to calculate the angle in a 360° range, it will be shown that the permanent magnet of the present invention may contain more than one single dipole, for example two dipoles as shown in FIG. 15, or three dipoles as shown in FIG. 24, or even more than three dipoles (not shown).

FIG. 15 shows an arrangement 150 as a second embodiment of the present invention. This arrangement also comprises a permanent magnet assembly 25 forming a magnetic field having magnetic field components with different angular periodicities at the location of the sensor device 6. In the embodiment illustrated, the magnet assembly 25 is composed of a regular quadrupole 26 and first and second cylindrical dipoles 27, 28, in the embodiment illustrated identical cylindrical dipoles, oriented parallel to the rotation axis 4, e.g. vertically, and magnetically oriented in opposite directions. In the embodiment illustrated, the rotation axis 4 of the rotor 2 is arranged exactly in the middle between the two dipoles 27, 28, and in parallel to their longitudinal axes.

The quadrupole 26 generates a primary magnetic field "Bp" which is rotation-symmetric and has a periodicity of 180°, in the same manner as described above. The two dipoles 27, 28 generate a secondary magnetic field "Bs" which does not have a periodicity of 180°.

Figure 16A:
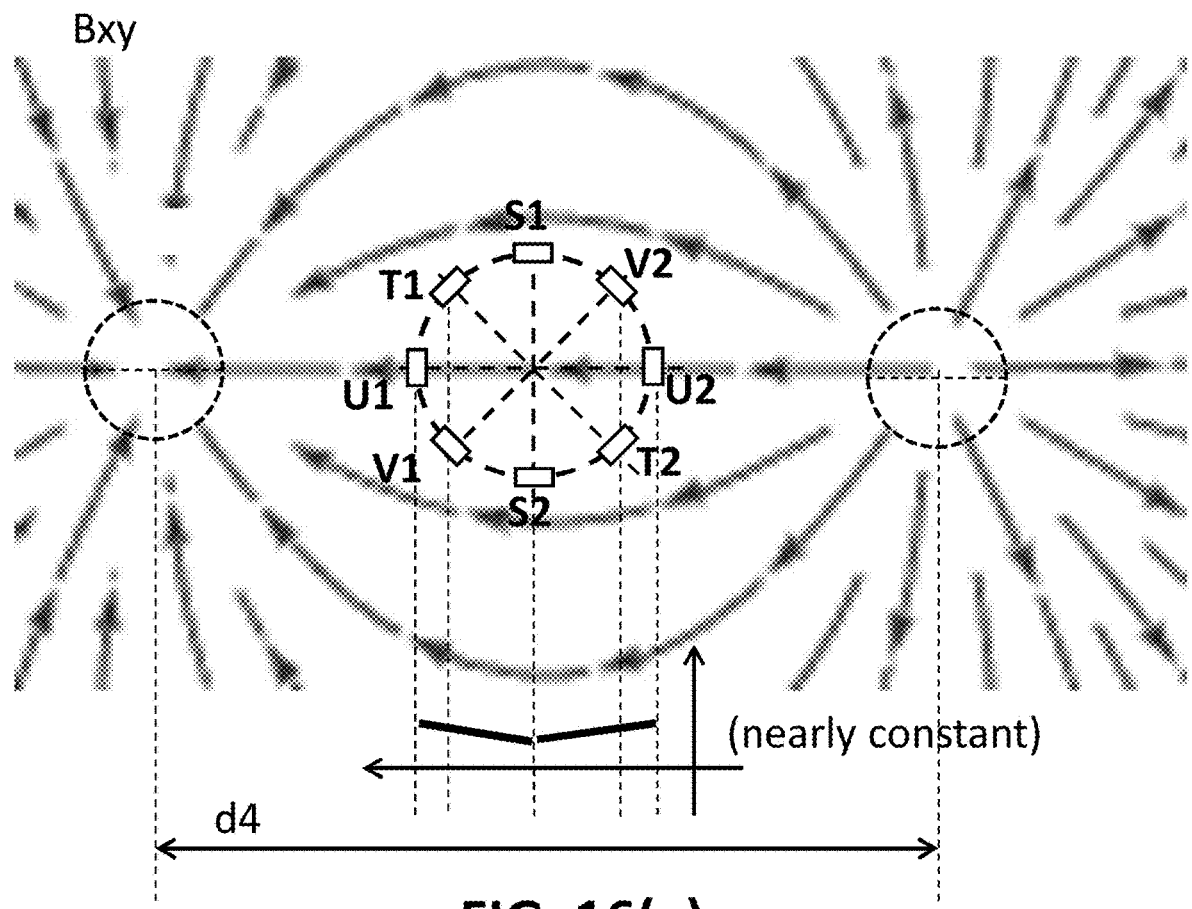
FIG. 16(a) illustrates the field lines in the XY plane of the secondary magnetic field "Bs" generated by the two dipoles of FIG. 15 (the field of the quadrupole is not shown).

FIG. 16(a) is a schematic drawing illustrating field lines of the secondary magnetic field Bs generated by the dipoles 27, 28 of the arrangement 150 illustrated in FIG. 15.

Figure 16B:
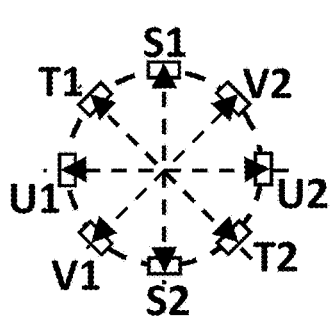
FIG. 16(b) and FIG. 16(c) show the impact of this secondary magnetic field "Bs" on the sums and differences of the primary signals measured by vertical Hall elements oriented radially or tangentially.

FIG. 16(b) shows the impact of the secondary magnetic field Bs created by the symmetrically arranged dipoles 27, 28, on the formulas of "diff1" and "diff2" mentioned above, for a sensor having eight primary sensor elements in the form of vertical Hall elements oriented for measuring a radial field "Br". As can be seen, the values of diff1 and diff2 surprisingly turn out to be exactly zero, despite the fact that the field is not constant. This means that the influence from the secondary magnetic field "Bs" on the measurement of the primary angle α1 is completely eliminated. Moreover, this is true irrespective of the dimensions of the radius of the first circle 8 (upon which the primary sensor elements are located). This implies that the accuracy of the measurement of the primary angle α1 is not negatively influenced by the presence of the secondary field, even if the distance d4 between the dipoles 27, 28 decreases, which means that not only the sensor device 6 can be miniaturized, but also the magnet assembly 25 itself can be miniaturized;

and this is possible, moreover, independently from each other. Since the price of magnets largely depends on their size (or weight), this means that it may be preferred to make the arrangement 150 of the present invention as small as allowed by the technology. This is a major advantage of embodiments of the present invention.

Figure 16C:
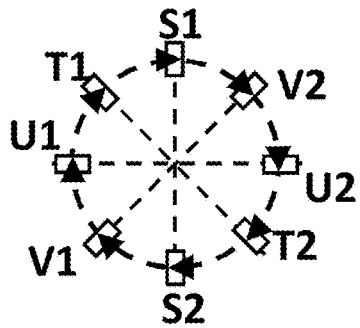

FIG. 16(c) shows that the same statement also holds for a sensor device 6 having eight primary sensor elements in the form of vertical Hall elements oriented for measuring a tangential field "Bt", which also appears to be completely eliminated by the sensor device 6 with eight sensor elements when using the "second algorithm".

Figure 17:
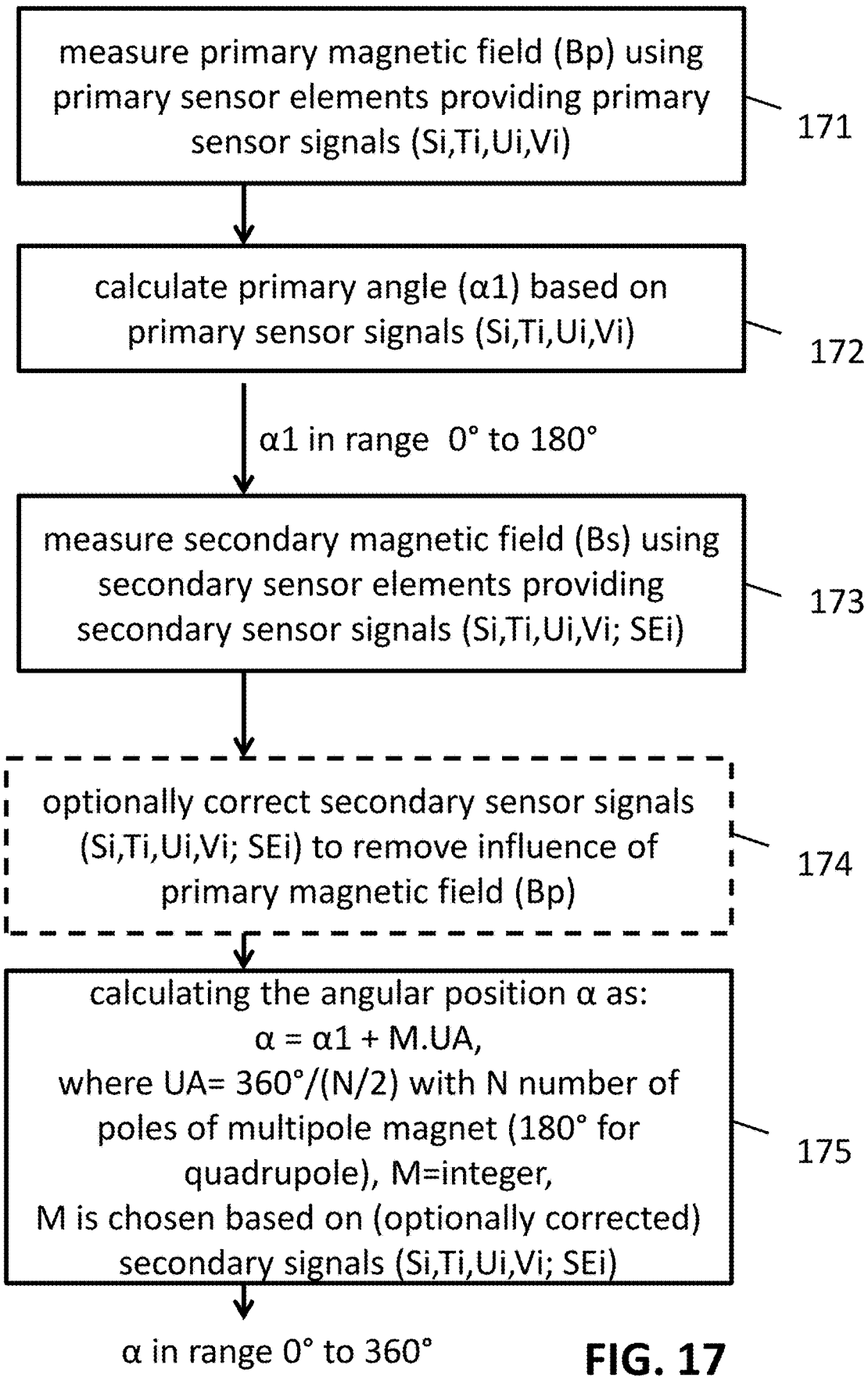
FIG. 17 is a flowchart illustrating a method for calculating an angular position in the range from 0° to 360°, according to an embodiment of the present invention. The first two steps are exactly the same as described in WO'885 as the "second algorithm". These steps provide an angle α1 in the range from 0° to 180° in case of a quadrupole. The remaining steps are used to convert the primary angle α1 to an angle in the range from 0° to 360°, using the secondary magnetic field.
Figure 18:
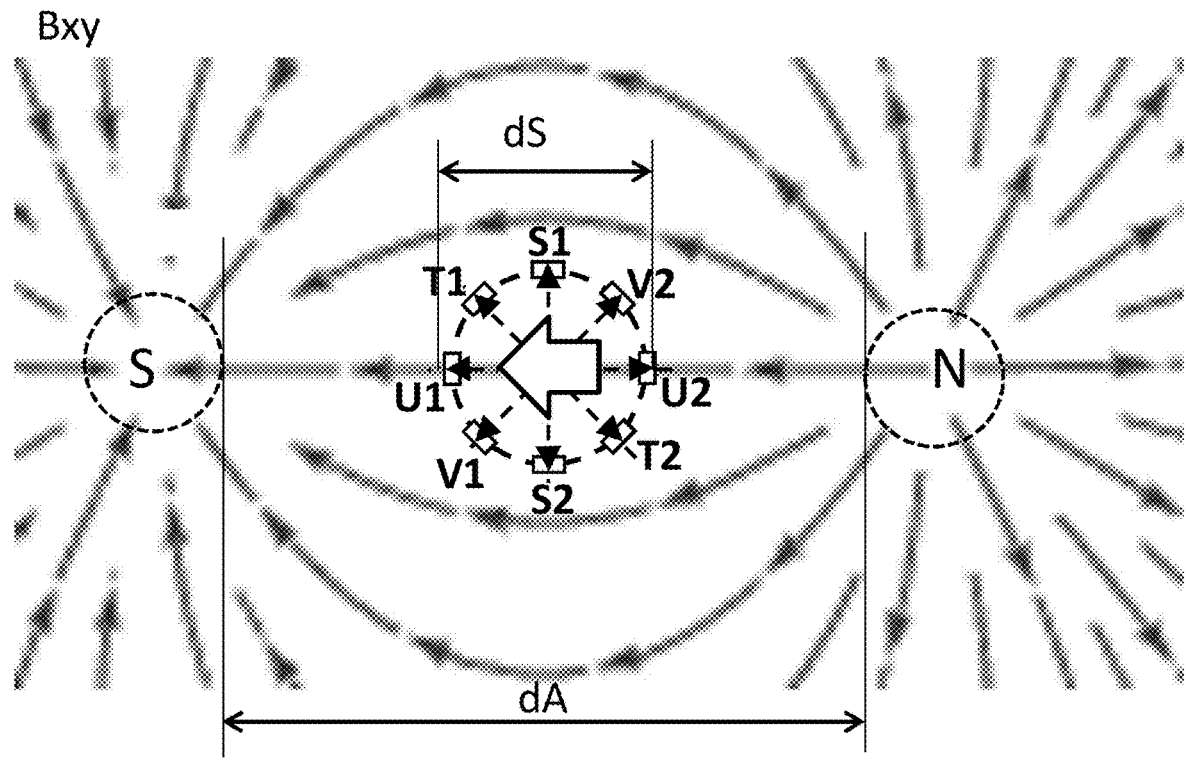
FIG. 18 shows an example of how the orientation (referred to herein as "secondary angle α2") of the secondary magnetic field of FIG. 16 (generated by the two dipoles of FIG. 15, corresponding to the signals obtained from the primary sensor elements after correction step 174, i.e. after "removal" of the primary magnetic field "Bp" generated by the quadrupole) can be determined using the (same) vertical Hall elements arranged for measuring the radial components "Br" of the rotation-symmetric magnetic field generated by the quadrupole.
Figure 19:
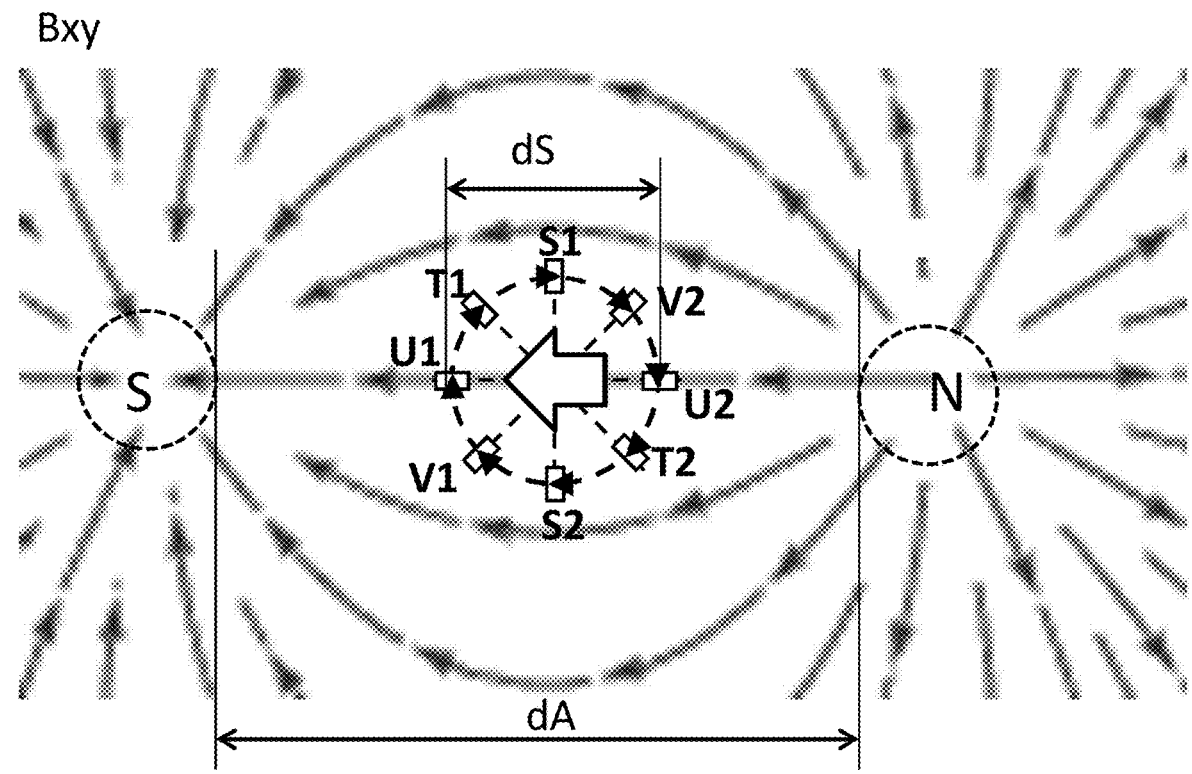
FIG. 19 shows an example of how the orientation (referred to herein as "secondary angle α2") of the secondary magnetic field of FIG. 16 (generated by the two dipoles of FIG. 15, corresponding to the signals obtained from the primary sensor elements after correction step 174, i.e. after "removal" of the primary magnetic field "Bp" generated by the quadrupole) can be determined using the (same) vertical Hall elements arranged for measuring the tangential components "Bt" of the rotation-symmetric magnetic field generated by the quadrupole.
Figure 21:
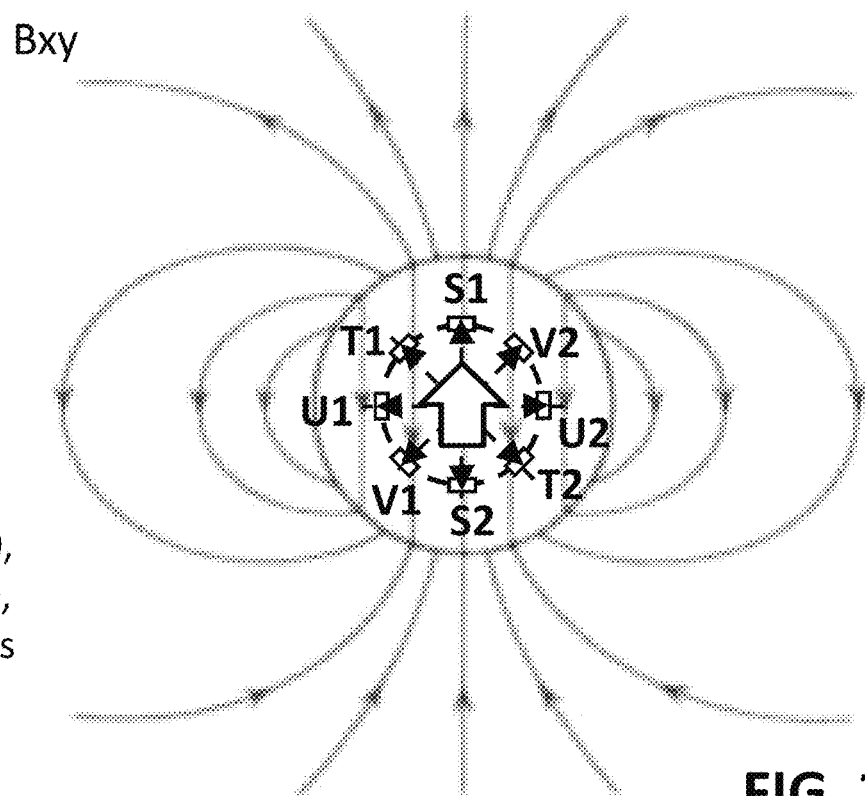
FIG. 21 is a variant of FIG. 18.
Figure 22:
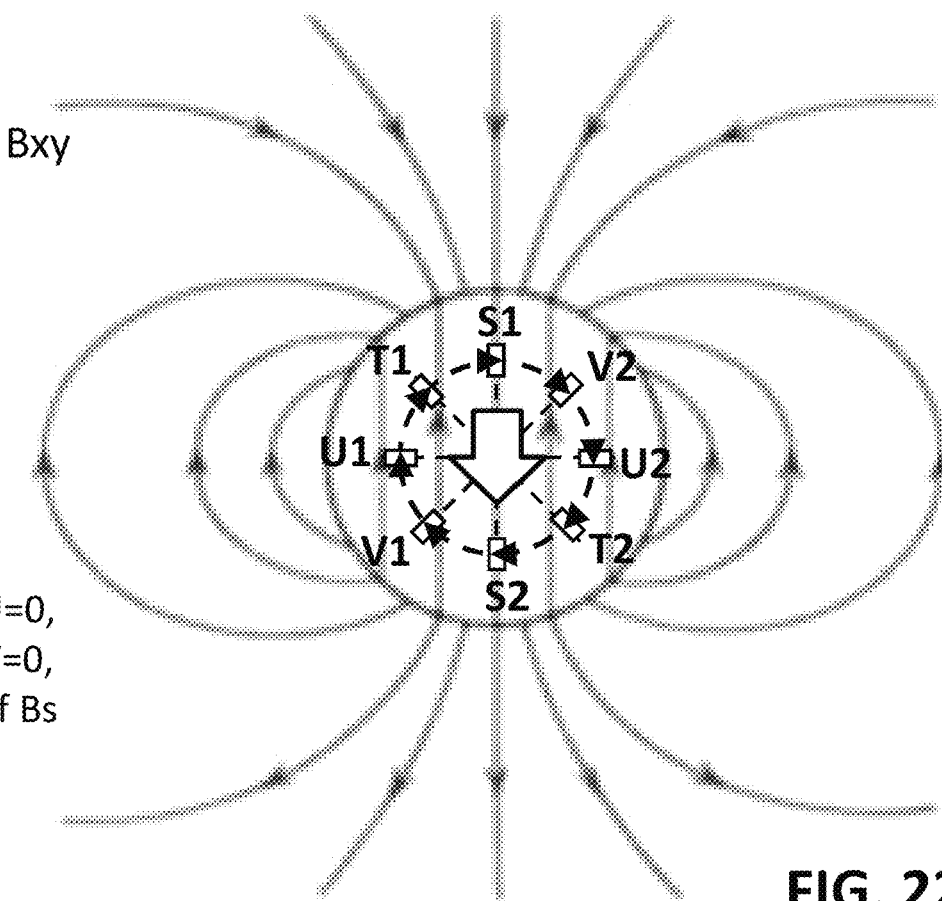
FIG. 22 is a variant of FIG. 19 showing the field lines of the secondary field "Bs" generated by the two outer ring segments of the magnet shown in FIG. 32 or FIG. 33, corresponding to the signals obtained from the primary sensor elements after correction step 174, i.e. after "removal" of the primary magnetic field "Bp" generated by the quadrupole).
Figure 23:
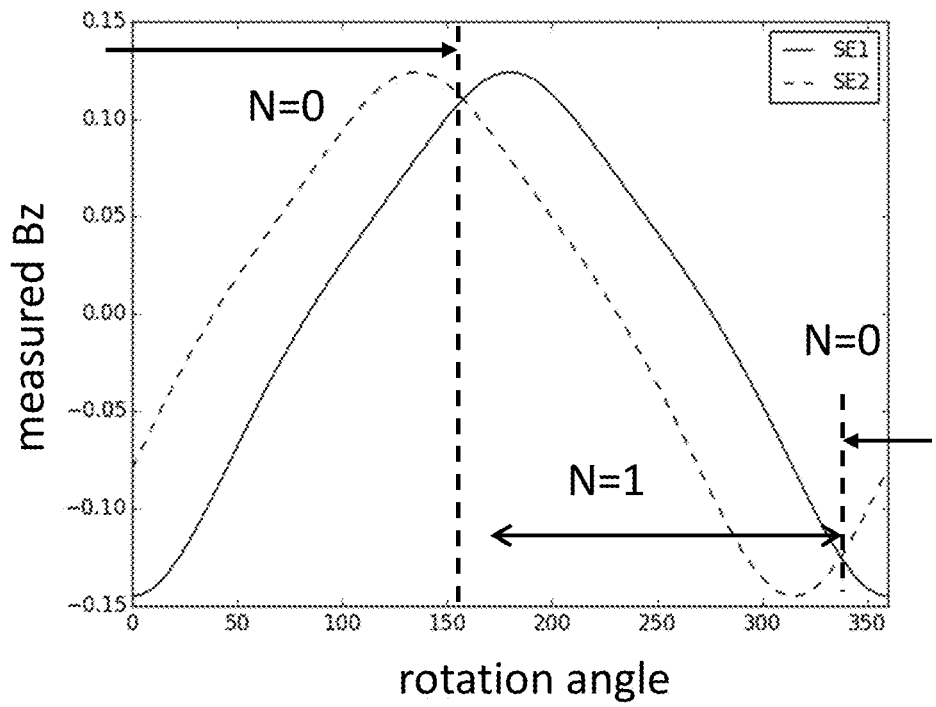
FIG. 23 shows how a comparison of two "Bz" signals like the signal of FIG. 14(b) and phase-shifted versions thereof, can be used to convert the primary angle α1 to an angle in the full 360° range.

FIG. 17 to FIG. 23 illustrate a method according to embodiments of the present invention. FIG. 17 is a general representation of the method. FIG. 18 to FIG. 20 illustrate a first specific embodiment, where the angle α2 of the secondary field Bs is measured or estimated using signals obtained from the primary sensor elements. FIG. 21 and FIG. 22 illustrate the same principle for the magnet of FIG. 32. FIG. 23 illustrates a second specific embodiment, based on phase shifted Bz-measurements obtained from horizontal Hall elements which may be part of the primary sensor elements or may be additional sensor elements.

FIG. 17 is a flowchart illustrating a method for calculating an angular position α1 of the rotor 2 with respect to the stator, where the angle is a value in the range from 0° to 360°.

The first step 171 of obtaining primary sensor signals S1,S2,T1,T2,U1,U2,V1,V2 from the primary sensor elements, and the second step 172 of applying the "second algorithm" (see formula [2] to [16] above), is the same as was done in the prior art, albeit that these steps are now performed for a non-rotation-symmetrical magnetic field having at least two magnetic field components with different angular periodicities at the location of the sensor device 6, the magnetic field being generated by a magnet assembly formed of a multipole magnet at the rotor 2 and at least one cylindrical dipole magnet eccentrically placed with respect to the rotor 2. The method steps 171, 172 provide a primary angle α1 in the range from 0° to 360°/(N/2) with N the number of magnet poles of the multipole magnet at the rotation axis of a rotor 2, e.g. 0° to 180° in case of a quadrupole, 0° to 120° in case of a six-pole, etc.

In a next step 173, the secondary magnetic field Bs generated by the at least one cylindrical dipole magnet is measured using secondary sensor elements. In some embodiments (e.g. where the sensor device does not have additional Horizontal Hall elements) this step 173 is actually the same step as step 171, in which case the signals S1 to V2 are also used as secondary signals. In other embodiments (where the sensor device has at least two additional Hall elements XE1, XE2), this step means measuring the magnetic field using these at least two additional Hall elements XE1, XE2, and providing the sensor signals SE1, SE2 obtained from these at least two additional sensor elements as the "secondary signals" (called "secondary signals" because they contain information about the "secondary magnetic field" Bs).

The method also contains an optional step 174 of correcting the secondary sensor signals S1 to V2 in some embodiments, or SE1, SE2, etc. in other embodiments, to remove the influence of the primary magnetic field Bp generated by the multipole, e.g. quadrupole, and for providing corrected signals. It is to be noted that this step is possible because at this stage, the primary angle α1 is known (albeit in a 180° range, but since the primary magnetic field is rotation symmetric with a periodicity of 180°, that is not a problem).

It is advantageous of using the corrected signals, because this reduces the risk of incorrectly estimating the orientation of the secondary magnetic field, and increases the sensitivity for an external field.

In step 175, the angular position α of the rotor 2 with respect to a stator 3 is calculated, using the formula α=α1+ M·UA, where UA is the Uncertainty Angle or Periodicity of 360°/(N/2) with N the number of magnetic poles of the multipole, e.g. 180° in case of a quadrupole, 120° in case of a six-pole, etc), and M is an integer value, 0, 1, ..., where M is chosen based on the optionally corrected secondary signals S1 to V2 in some embodiments, SE1,SE2, etc. in other embodiments.

It is an advantage that the calculations for determining the value of M can be performed by simple Boolean or arithmetic operations, e.g. including comparisons, or finding a maximum or minimum value.

The idea behind this formula is that the uncertainty is resolved based on an estimation of an orientation (referred to herein as the secondary angle α2) of the secondary magnetic field Bs generated by the dipole(s). This estimation can be performed in different ways, as will be explained further, but the invention is not limited to only these specific ways, and other ways may also be used.

FIG. 18 shows a first specific example for determining the secondary angle α2 of the secondary magnetic field Bs, for a sensor device 6 having eight vertical Hall elements arranged for measuring the radial components "Br" of the primary magnetic field Bp generated by the quadrupole. What is shown are the field lines of the secondary magnetic field Bs only, assuming that the influence of the primary magnetic field Bp was removed in step 174, at least for a subset of the signals S1 to V2. Depending on the magnitude of the signals, the optional step 174 may not be necessary.

In this example, the individual signals S1 to V2 obtained from the primary sensor elements are also used as the secondary signals SE1 to SE8. The second angle α2 can then be readily determined, for example by finding the primary sensor element that yields the largest positive signal. In the example shown, that would be the sensor element corresponding to signal U1, hence, the second angle α2 would be chosen as the direction corresponding to this sensor element, in this example, pointing to the left of the drawing. Instead of finding the maximum value, it would also be possible to find the lowest value (most negative), which in this case would be signal U2, and then choosing the opposite direction (again to the left of the drawing). Since there are N*2 sensor positions, with N the number of magnetic poles of the multipole, e.g. eight sensor positions in case of a quadrupole, and there can be only selected extreme value, e.g. one maximum value or one minimum value, the resulting angle α2 will be an integer multiple of 360°/(N*2), e.g. an integer multiple of 45° for eight sensor positions, but that is sufficiently accurate, because the second angle α2 is only used to decide whether or not 180° needs to be added to the primary angle α1 determined in step 172. Hence, for the sensor device 6 of the illustrated embodiment, having eight vertical Hall elements oriented for measuring the radial field "Br", no additional Hall elements are needed for measuring the secondary magnetic field Bs, only the software of the sensor device needs to be changed.

Although FIG. 18 illustrates field lines generated by two dipoles, it shall be understood that the same steps of optionally correcting the signals S1 to V2, and finding the maximum or minimum of the optionally corrected signals S1 to V2 can also be applied for determining the secondary angle α2 of the secondary magnetic field generated by a single dipole (see FIG. 12a). Also in this case, the sensor corresponding to signal U1 would yield the largest value, hence the sensor can detect that the secondary field Bs of FIG. 12(a) also points to the left.

Depending on the relative angular position (offset) of the quadrupole 26 and the one or more dipoles 27, 28, (which is fixed for a given magnet, and may be hardcoded in the program or stored in a non-volatile memory), the second angle α2 can be corrected for this offset, and it can then be determined whether or not 180° should be added to the primary angle α1, depending on which of the angles α1 or α1+180° corresponds best to the estimated and optionally offset-corrected angle α2, using any suitable distance criterion, for example: minimum angular distance.

FIG. 19 shows a second specific example for determining the secondary angle α2 of the secondary magnetic field Bs, for the particular embodiment of a sensor device 6 having eight vertical Hall elements arranged for measuring tangential components "Bt" of the primary magnetic field Bp generated by a quadrupole 26. Also in this case the largest value of the eight primary signals S1 to V2 can be found, which in this case would be the signal S2. The secondary angle α2 thus obtained would be the arrow-symbol indicated in the sensor element corresponding to S2, which again is pointing to the left of the drawing. Hence, also for this sensor device having eight vertical Hall elements oriented for measuring the tangential field, no additional Hall elements are needed for measuring the secondary magnetic field Bs. In case the minimum value was found, the result would be signal S1, and the direction of α2 would be chosen opposite to the arrow-symbol, hence again, pointing to the left of the drawing. Again, depending on the relative angular position (offset) of the multi-pole magnet and the dipole(s), it can then be determined which of the angles α1 or α1+180° corresponds best to the estimated and optionally offset-corrected angle α2.

Instead of finding a maximum or minimum value, the orientation α2 of the secondary magnetic field Bs can for example also be found by considering (U2−U1) as a cosine signal and (S1−S2) as a sine-signal, or based on other combinations of two or more of the primary signals.

Disturbance Field:

The method described above also works very well in the presence of an unwanted disturbance angle (Fremdfeld), because:

1) the primary angle α1 as determined by the "second algorithm" (step 172) is highly insensitive for a constant external field, (as described in WO'885), and
2) the secondary angle α2 can also be determined in a manner which is highly insensitive against an external field, as will be explained next.

Referring to FIG. 20, assume the primary angle α1 calculated in step 172 is the angle shown in FIG. 20(a). That means that the "real" rotor position is either in position α1 or in position α1+180°, as shown in FIG. 20(b). Suppose that a constant external field Bfremd is present, with a magnitude and size as shown in FIG. 20(c), and assume that the secondary angle α2 was determined as a vector pointing to the left and having an amplitude as shown in FIG. 20(d), then the actual secondary field Bs_real would be the vector shown in FIG. 20(e) instead of the estimated vector shown in FIG. 20(d). Since, however, the vector Bs_estimate is "closer" to the vector α1 shown in FIG. 20(a) than it is to α1+180° as shown in FIG. 20(b), it is decided that 0° should be added (i.e. that the value of M=0 should be chosen) which yields the correct result.

FIG. 20(f) shows several other examples of vectors representing the external field Bfremd, and FIG. 20(g) shows that the correct decision to choose (α1) rather than (α1+180°) as the closest angle is taken, as long as the magnitude Bs_real of the secondary magnetic field is larger than the magnitude of the external field Bfremd. From these figures it can be understood that the method of the present invention provides an accurate and correct result for the angle α in the range from 0° to 360°, even in the presence of an external disturbance field Bfremd (having a magnitude smaller than that of the secondary magnetic field).

It is noted that the estimate of the secondary field vector Bs_estimate may be used to provide an estimate of the strength of the external field Bfremd. This is possible because the field strength of the secondary magnet portion is fixed, e.g. predefined or measured during calibration, and can be hardcoded or stored in a non-volatile memory. The thus calculated strength-value of the external field Bfremd may optionally be output by the sensor, and can for example be used as an indication of the reliability of the measurement, which is important in some applications.

Figure 32:
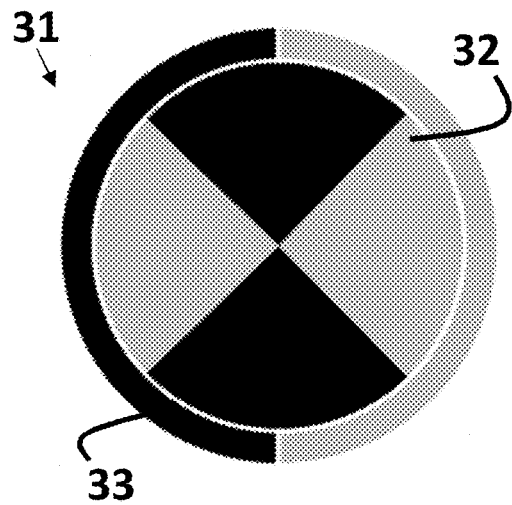
Figure 33:
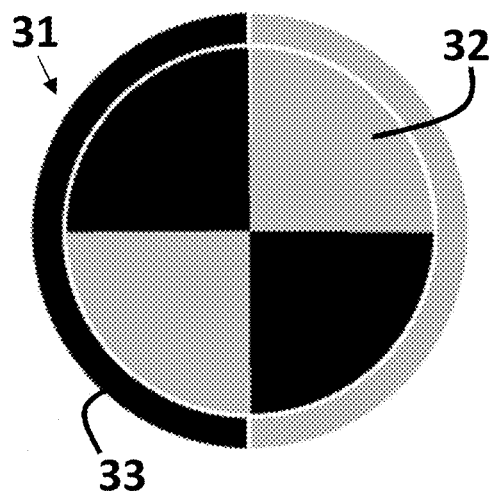

FIG. 21 is a variant of FIG. 18 for a magnet assembly 31 of the type illustrated in FIG. 32 or FIG. 33, where the primary magnetic field is generated by a regular 4-pole disk magnet 32, and the secondary field is formed by two half-ring portions 33. FIG. 21 shows the field lines of the secondary field Bs only, after performing the correction step 174. It is noted that the field lines of this secondary magnetic field Bs are uniform, and that the second algorithm completely cancels this field, hence the presence of the secondary field Bs does not negatively influence the measurement of the primary angle α1 related to the primary magnetic field Bp generated by the quadrupole. The same principles as explained in FIG. 18 can also be used here for determining the secondary angle α2.

FIG. 22 is a variant of FIG. 19 for the magnet assembly 31 of FIG. 32 or FIG. 33, illustrating another example of how the orientation of the secondary magnetic field can be measured using vertical Hall elements oriented tangentially to the first circle.

From FIG. 12(a) to FIG. 12(d) and FIG. 16(a) to FIG. 16(c), FIG. 18 and FIG. 19 and FIG. 21 and FIG. 22, it shall be clear for the skilled person having the benefit of this disclosure that, using the principles of the present invention, the primary angle α1 can be measured in the same way as described in WO'885 with no or only little influence of the presence of the secondary field Bs because the sensor arrangement with the second algorithm is highly or completely robust against such secondary fields, and that the secondary field Bs can be used to resolve the limited measurement range due to the periodicity of the primary magnetic field. This is shown in FIG. 12 for a single cylindrical dipole, in FIG. 16 and FIG. 18 for a pair of cylindrical dipoles, and in FIG. 21 and FIG. 22 for a pair of half-circular dipoles. From these examples the skilled person will understand that the shape of the secondary magnet portion may have a minor influence on the accuracy of the primary angle α1, but that the angular position of all embodiments described herein can be determined in the full 360° range.

FIG. 23 will be used to explain how the secondary angle α2 can be found using the signals from at least two or at least three horizontal Hall elements, and will be described further.

FIG. 24 shows another exemplary arrangement 240 as a third embodiment of the present invention. This arrangement comprises a permanent magnet assembly 40 composed of a discrete regular quadrupole 41 and three individual cylindrical dipoles 42, 43, 44. The dipoles 42, 43, 44 are oriented vertically (i.e. orthogonal to the plane of the quadrupole 41, in the embodiment illustrated the XY plane), and at least two of them are oriented in opposite directions, in the embodiment illustrated dipoles 42 and 43 are oriented opposite to dipole 44. The quadrupole 41 generates a primary magnetic field Bp which is rotation-symmetric about the rotation axis 4 with a periodicity of 180°. The set of three dipoles 42, 43, 44 generates a secondary magnetic field Bs which is not rotation symmetric about the rotation axis 4.

It is noted that, if the three dipoles 42, 43, 44 would all be oriented upwards or all oriented downwards, i.e. would all be oriented in the same direction, the secondary field Bs would be rotation symmetric with a periodicity of 120°, which would not work. The magnetic field generated by this set of dipoles 42, 43, 44 would be the superposition of three magnetic fields of the kind shown in FIG. 12(a). In contrast to the set of two dipoles shown in FIG. 15, the field generated by the three dipoles 42, 43, 44 would not be completely eliminated by the "second algorithm", hence would induce a small error in the primary angle α1. As described in relation to FIG. 12, this error is actually small when taking into account real dimensions and field strengths, and can be further reduced by choosing a smaller radius of the first circle 8 and/or a larger distance between the rotation axis 4 and the longitudinal axes of the dipoles, and/or by decreasing the strength of the secondary magnetic field Bs relative to the primary magnetic field Bp.

In the embodiments described above, the sensor device 6 has eight primary sensor elements in the form of vertical Hall elements oriented radially or tangentially, and the same primary sensor elements, or a subset thereof are also used for detecting the secondary magnetic field Bs generated by the one more dipoles, but that is not absolutely required.

Figure 25:
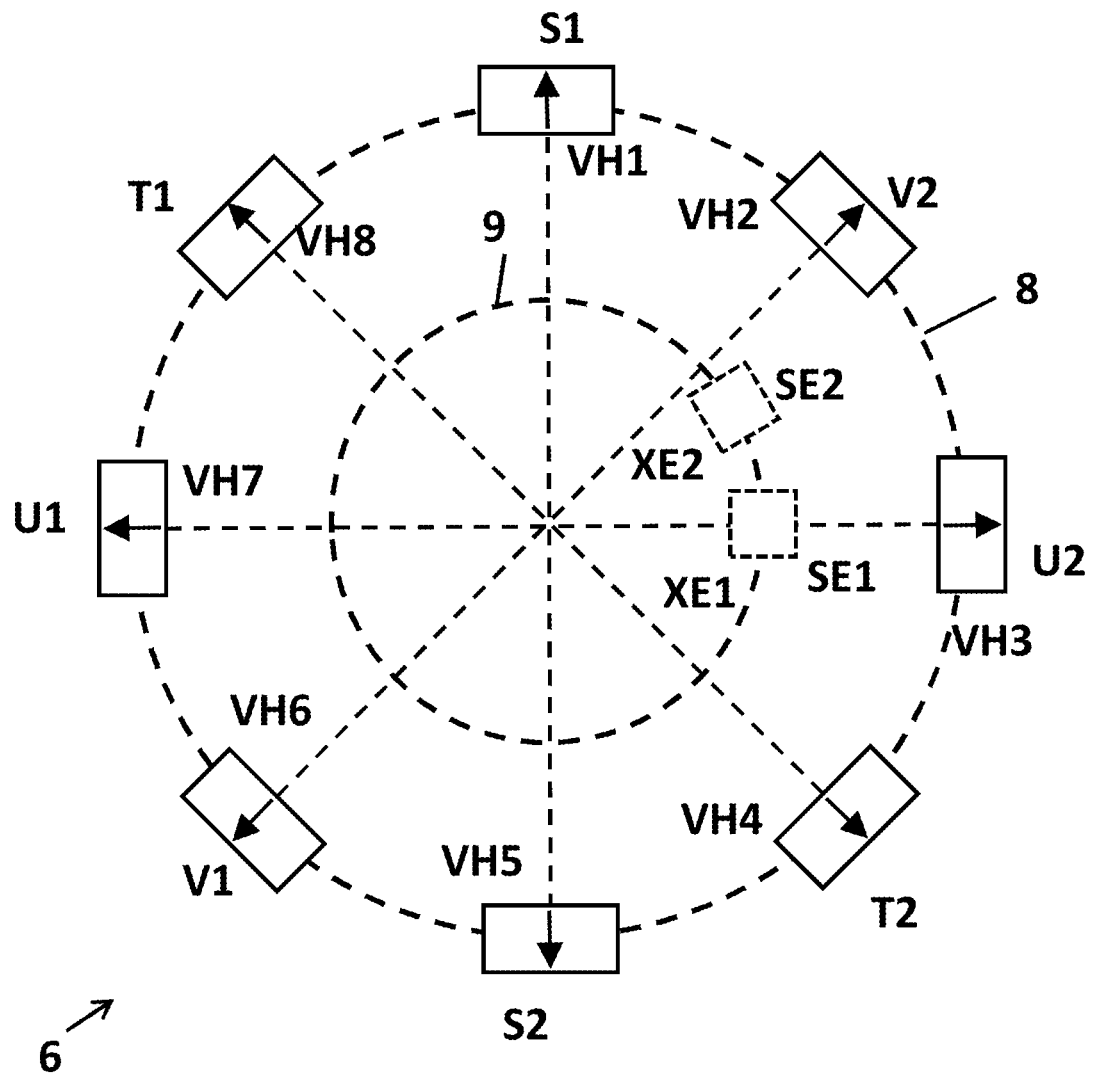

The sensor device 6 shown in FIG. 25 has at least two additional, horizontal Hall elements XE1, XE2 (only two of which are shown) arranged on a second circle 9 concentric with the first circle 8. In this example, the radius of the second circle 9 is smaller than the radius of the first circle 8, but it could also be the same or larger. The at least two additional Hall elements XE1, XE2 are shown at an angular distance of about 35° is this example, but that is not required, and any angle in the range from about 5° to about 175° would also work, although it is preferred to keep this angle relatively small, for example in the range from 5° to 45°. The use of Horizontal Hall elements is advantageous in that they provide higher sensitivity and feature a smaller offset as compared to vertical Hall elements.

The at least two horizontal Hall elements XE1, XE2 provide signals SE1, SE2 indicative for the value of the vertical field component Bz of the total magnetic field between the magnet and the sensor, e.g. of the magnetic field shown in FIG. 13(b) and FIG. 13(d).

FIG. 23 illustrates that by comparing the signals SE1 and SE2 (e.g. by finding the largest of the two signals), it can be determined whether or not 0° or 180° should be added to the primary angle α1. In this example, if SE1> SE2, then in method step 175, M is set equal to 0, and 0° will be added to the primary angle α1. If SE1<SE2, then in method step 175, M is set equal to 1, and 180° will be added to the primary angle α1. While this is correct in theory, in practice sometimes the wrong decision may be taken in case the signals S1 and S2 are almost the same (which in the example of FIG. 23 is the case for α1 close to 160° and close to 340°, but this problem can easily be solved by using at least three Horizontal Hall elements XE1, XE2, XE3 (not shown), because, if for example the signals SE1 and SE2 would be almost the same, SE1 and SE3 or SE2 and SE3 will be quite different. It is noted that this principle is highly robust against a constant external field, because adding a same value to all signals SE1, SE2 and optionally SE3 does not change the outcome of the comparison(s).

Thus, adding at least two additional sensor elements XE1, XE2 to the sensor 6, allows to find the secondary angle α2 in a manner which is substantially robust against a constant stray field. The use of at least three additional sensor elements XE1 to XE3 will allow to find the secondary angle α2 in a manner which is substantially robust against a stray field with a constant gradient.

As can be seen in FIG. 23, where each of the signals SE1 and SE2 correspond to signals Bz1 and Bz2 of the combined magnetic field (primary field Bp and secondary field Bs) shown in FIG. 14(b), the comparison may be performed directly on the secondary signals SE1, SE2 themselves, even without the optional correction step 174 (of FIG. 17). In other embodiments, the correction step 174 is performed before doing the comparison.

Figure 26:
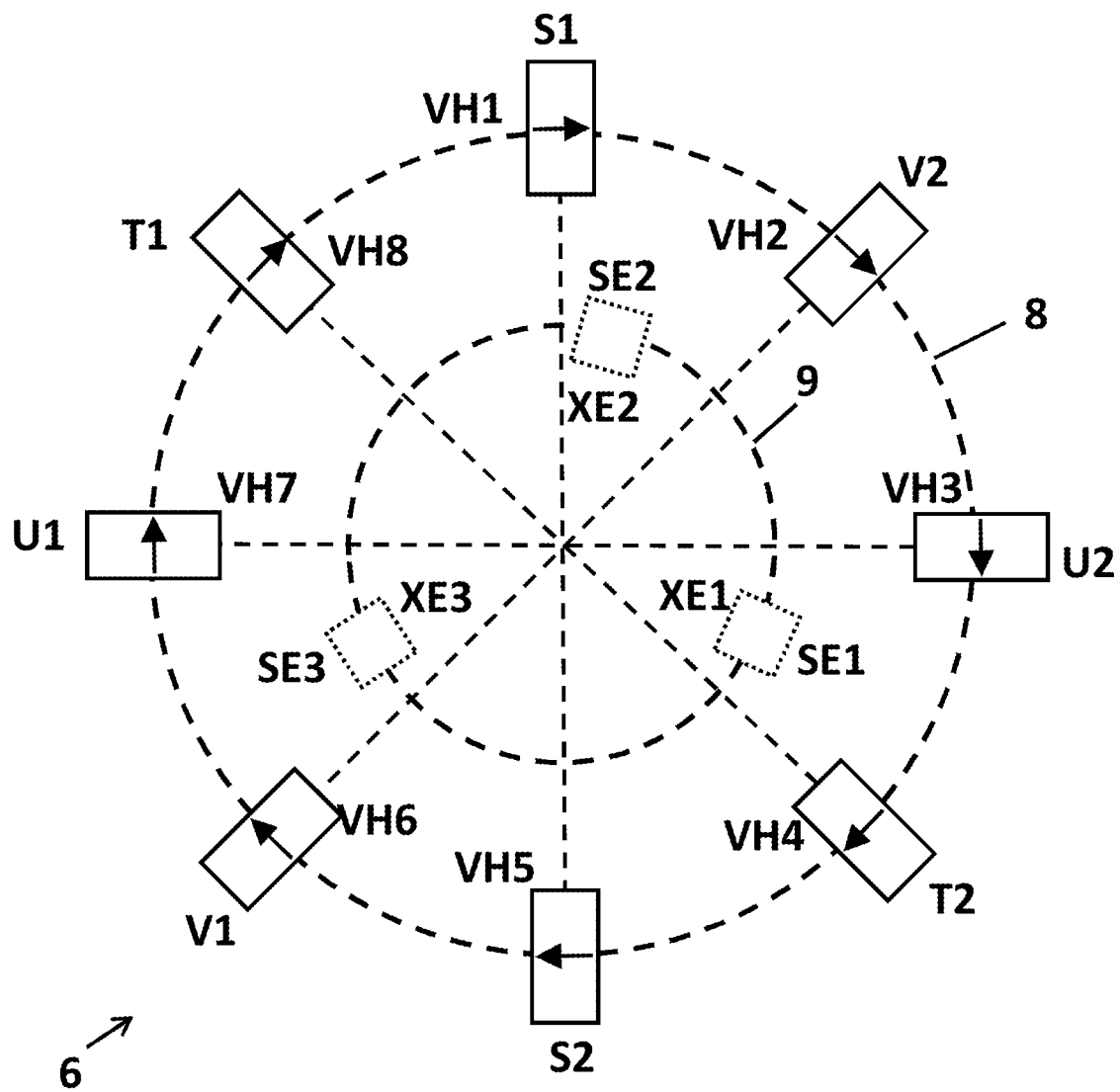

FIG. 26 shows another sensor device 6 according to an embodiment of the present invention. This sensor device has eight primary sensor elements in the form of vertical Hall elements VH1 to VH8 oriented for measuring a tangential field Bt and located on a first circle 8, and has three additional secondary elements XE1, XE2, XE3 in the form of Horizontal Hall elements located on a second circle 9 concentric with the first circle 8. The radius of the second circle 9 can be chosen smaller than, equal to, or larger than the radius of the first circle 8 on which the primary sensor elements are located. As can be seen, the positions of the additional sensor elements XE1, XE2, XE3 need not be related to the positions of the primary sensor elements, and can be chosen independently. Of course the relative angular positions of all sensor elements are taken into account in step 175. These relative positions are typically hardcoded, because they are independent of the magnet assembly being used, but could also be stored in non-volatile memory.

The secondary sensor elements XE1, XE2, XE3 provide signals SE1, SE2, SE3 indicative for the value of the vertical field component Bz of the total magnetic field between the magnet and the sensor. These values may optionally be compensated to subtract the influence of the symmetrical field Bz generated by the quadrupole, but that is not absolutely required.

The decision as to whether 0° or 180° (in case of a quadrupole) or more generally 360°/(N/2) with N the number of magnetic poles of a multipole magnet should be added to the primary angle α1 or not, can, as described in relation to FIG. 25, be based on comparisons of the signals SE1, SE2, SE3. The horizontal Hall elements may optionally have IMC on top, but that is not required. It is an advantage of using a horizontal Hall element in combination with IMC, in that the IMC can bend the magnetic field lines, allowing the horizontal Hall element to measure signals it could otherwise not measure. IMC provides for a signal amplification in a passive way.

Figure 27A:
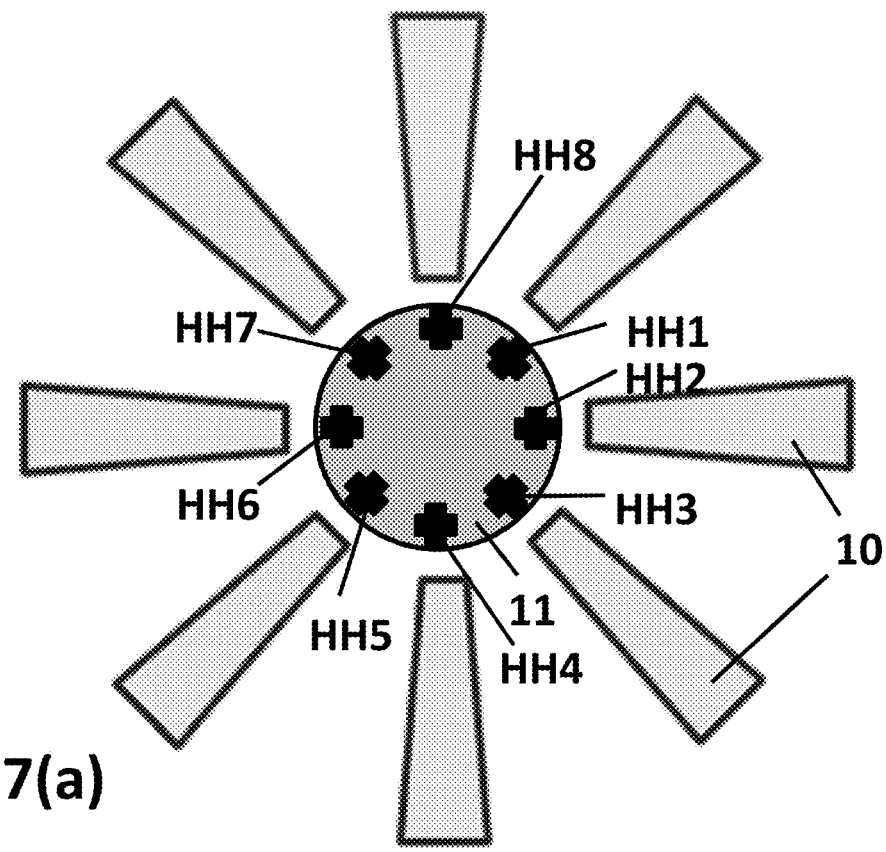
FIG. 27(a) shows a top view of a sensor device according to an embodiment of the present invention, having eight horizontal Hall elements and further comprising Integrated Magnetic Concentrators in the form of a central disk and a plurality of elongated strips, the Hall elements being arranged under the central disk. This drawing is similar to FIG. 26 of WO'885, but the number of sensor elements and strips is different, and the algorithm for calculating the angle is different.
Figure 27B:
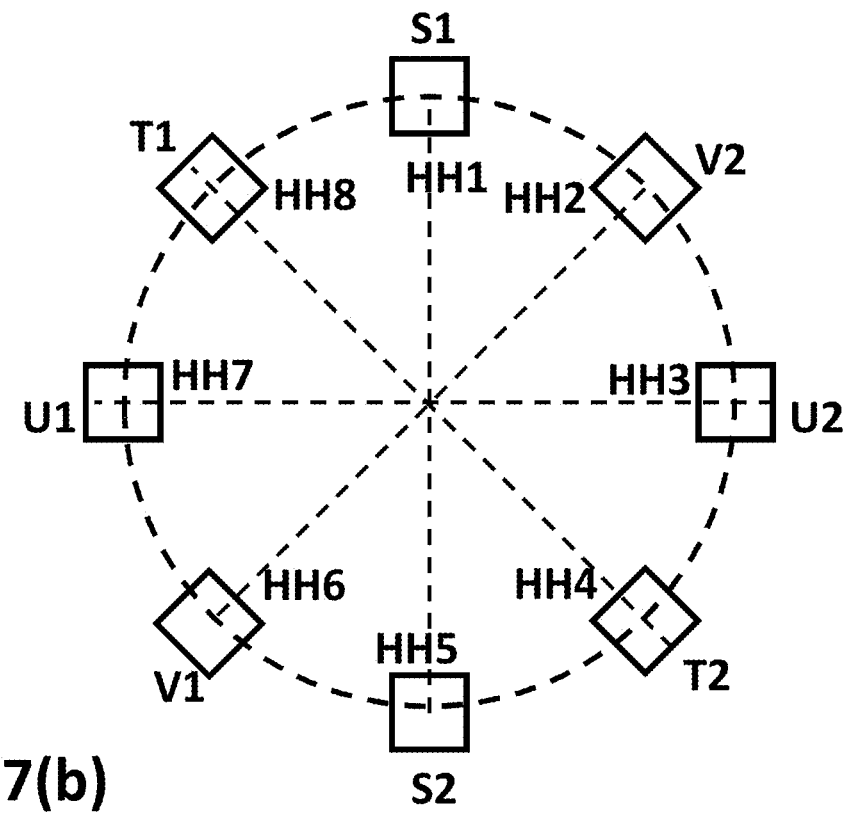
FIG. 27(b) illustrates the sensor elements and their signals.

FIG. 27(a) and FIG. 27(b) show an embodiment of a sensor device 6 according to the present invention, having eight horizontal Hall elements HH1 to HH8 and further comprising Integrated Magnetic Concentrators in the form of a central disk 11 and a plurality of radially oriented elongated strips 10, the Hall elements being arranged under the central disk 11. This drawing is similar to FIG. 26 of WO'885, but the number of sensor elements and strips is different. FIG. 27(a) shows a top view of the sensor device, FIG. 27(b) illustrates the primary sensor elements HH1 to HH8 and their signals S1–T1.

In a method of determining an angle in the range from 0° to 360° using this sensor, the primary angle α1 would be calculated in step 172 using the "second algorithm" (for example using formula [2] or formulas [3]-[10] or formulas [11]-[14] or formulas [15]-[16]). No additional secondary sensor elements XE1, XE2, etc. are needed for measuring the Bz field shown in FIG. 13(d), because the signals S1 to V2 already contain information about the secondary field Bs, hence the primary signals can also be used as secondary signals SE1 to SE8. It is an advantage of this embodiment that it does not require dedicated secondary sensor elements, as this saves space.

Step 174 of the method would mean to subtract the field shown in FIG. 13(c) from the values obtained from the primary sensors HH1 to HH8, once the primary angle α1 is determined, but this step is optional. The signals SE1 to SE8 can then be used to determine the orientation of the secondary magnetic field, for example by finding the largest (maximum) signal of the individual sensors, or by finding the smallest (minimum), and by choosing the rotor position α as α1 (N=0 in step 175) or α1+180° (N=1 in step 175) depending on which of these angles corresponds best to the orientation α2 of the secondary magnetic field, optionally taking into account angular offset between the primary magnetic field Bp and the secondary magnetic field Bs of the magnet, as described above.

Figure 28A:
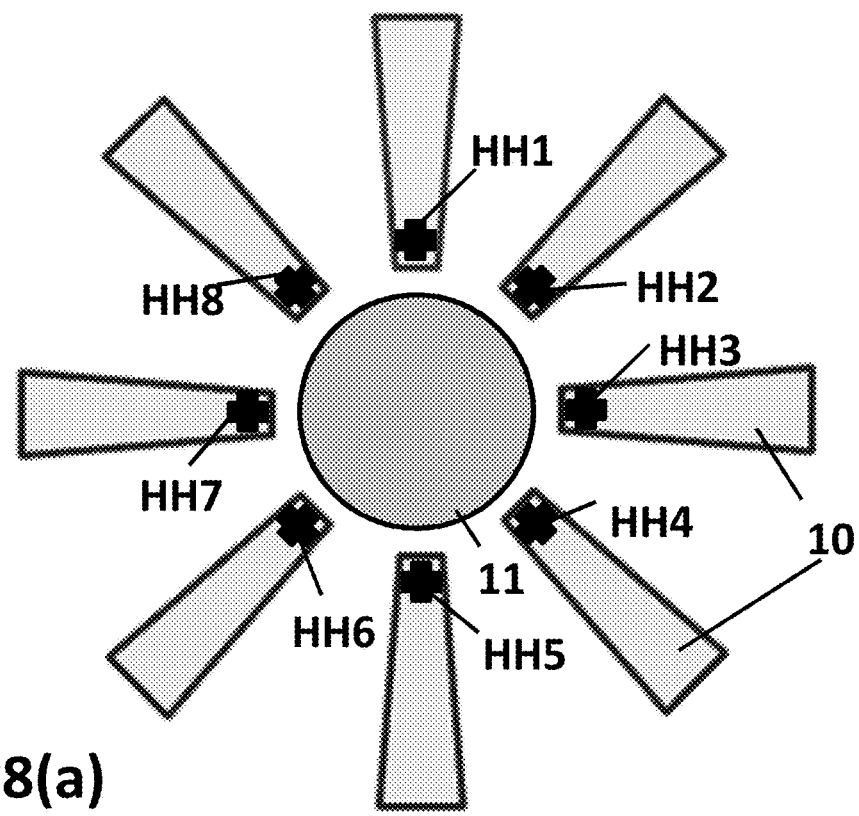
FIG. 28(a) shows a top view of a variant of the sensor device shown in top view in FIG. 27(a). The eight primary sensor elements are located under the elongated strips. This drawing is similar to FIG. 27 of WO'885, but the number of sensor elements and strips is different, and the algorithm for calculating the angle is different.
Figure 28B:
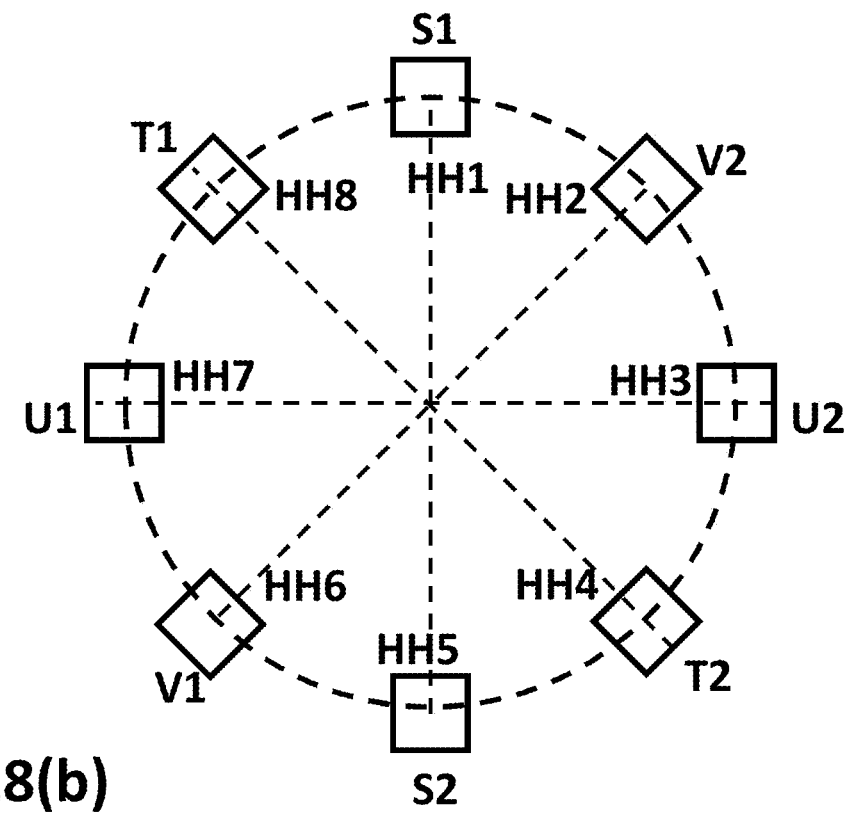
FIG. 28(b) illustrates the sensor elements and their signals.

FIG. 28(a) and FIG. 28(b) show a variant of the sensor device shown in FIG. 27(a) and FIG. 27(b), where the eight primary sensor elements HH1 to HH8 are located under the radially oriented elongated strips 10 rather than under the central disk 11. In fact, the central disk 11 is not required in this embodiment, and may be omitted.

Figure 29:
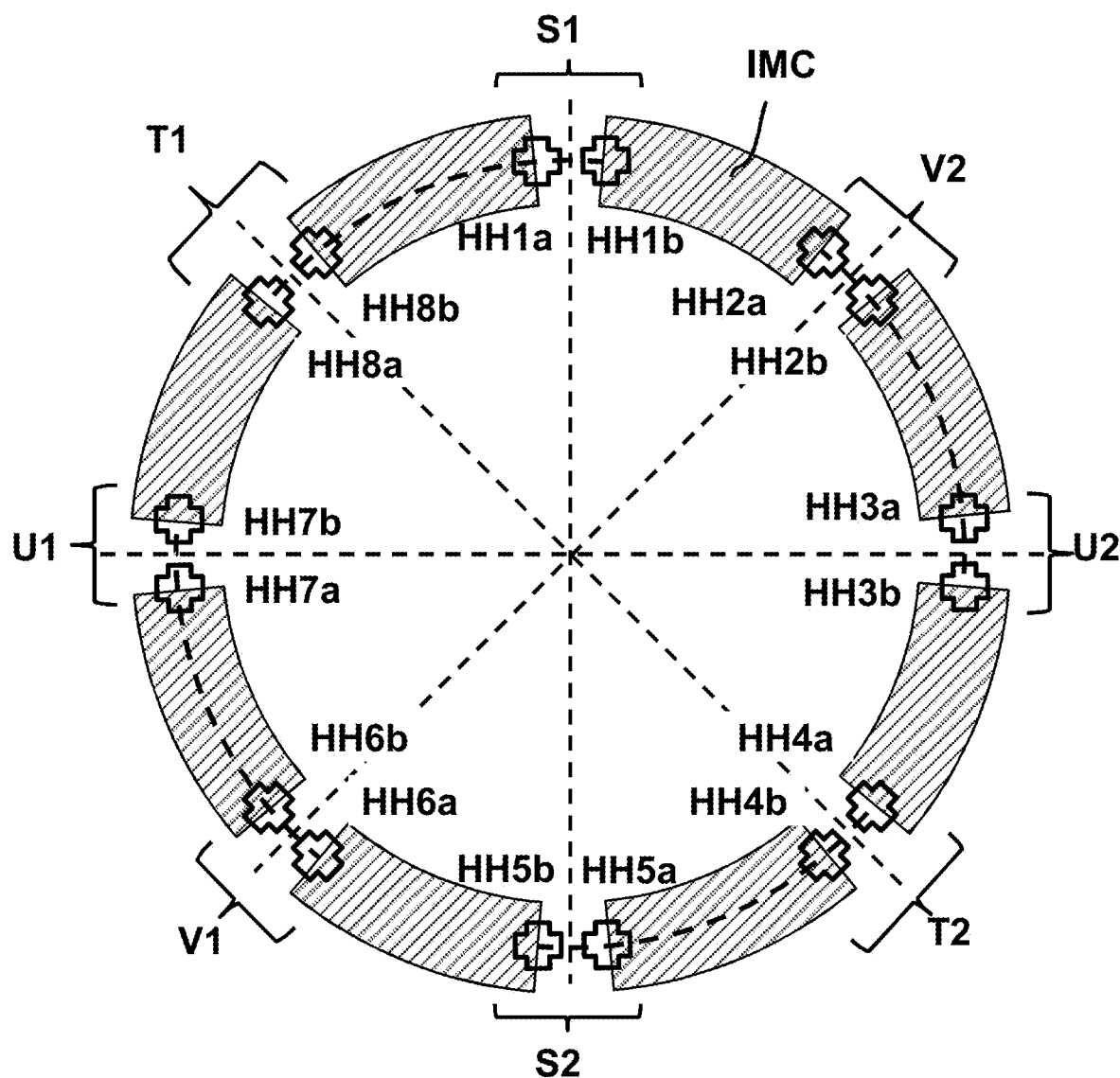

FIG. 29 shows an embodiment of a sensor device 6 according to the present invention, having eight pairs of horizontal Hall elements and further comprising Integrated Magnetic Concentrators (IMC) in the form of ring segments arranged above the first circle 8 on which the sensor elements are located. This drawing is similar to FIG. 19 of WO'885, but the number of sensor elements and IMC-strips is different, and the method for calculating the angle α is different, in particular the second part of the method (i.e. steps 173-175). This embodiment does not have dedicated secondary sensor elements, because the signals S1 to V2 can be used as secondary signals for deciding whether or not to add 180°, e.g. by finding the maximum or minimum value, as described above.

Figure 30:
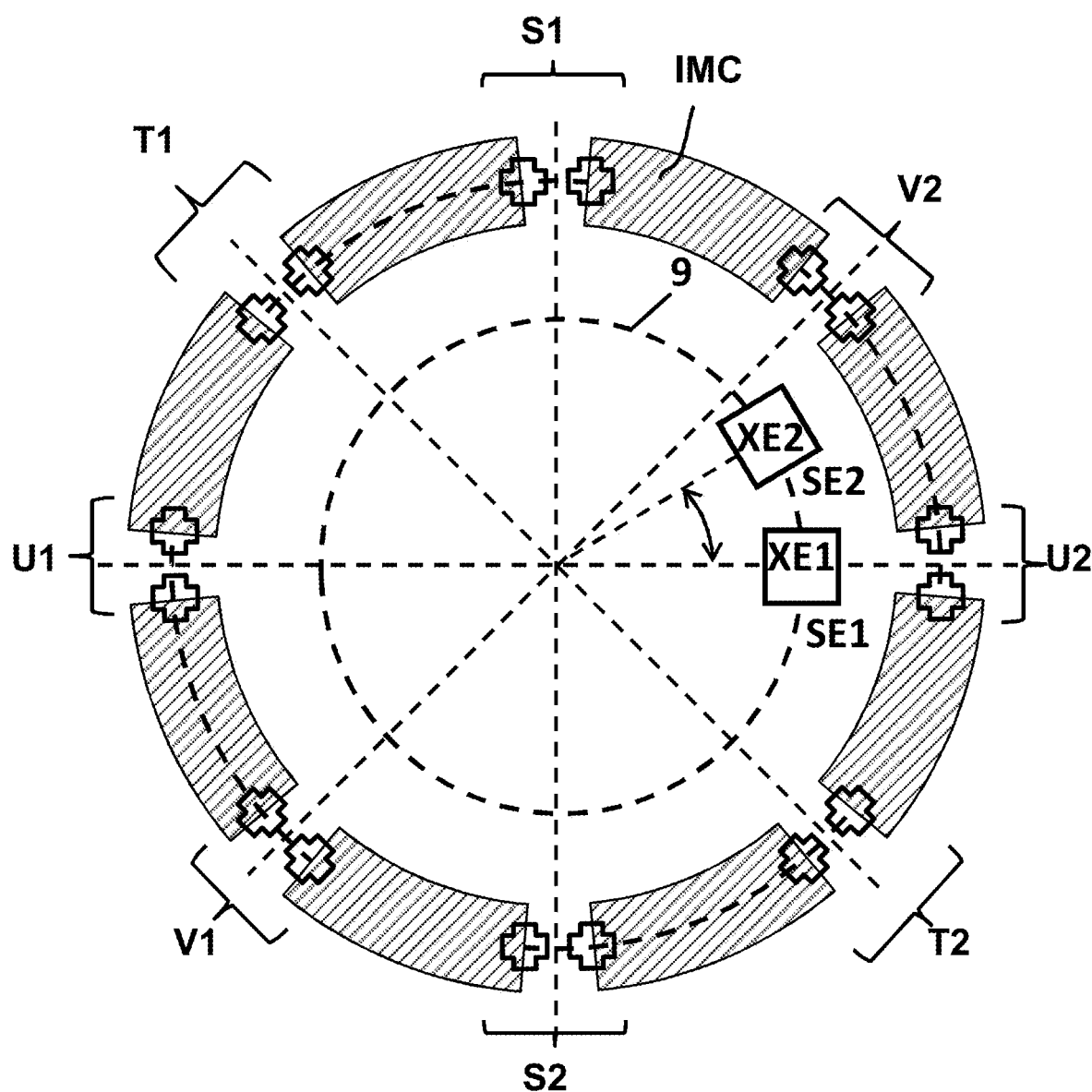

FIG. 30 shows a variant of the embodiment of FIG. 29, where two additional sensor elements XE1, XE2 are added, which can be used to determine whether or not 180° should be added, depending on which of the additional signals SE1, SE2 is larger, as discussed in relation to FIG. 26. As explained above, it would be better to have at least three additional Hall elements XE1, XE2, XE3 (not shown).

FIG. 31 to FIG. 60 illustrate several examples of magnets which can be used in embodiments of the present invention.

Figure 31A:
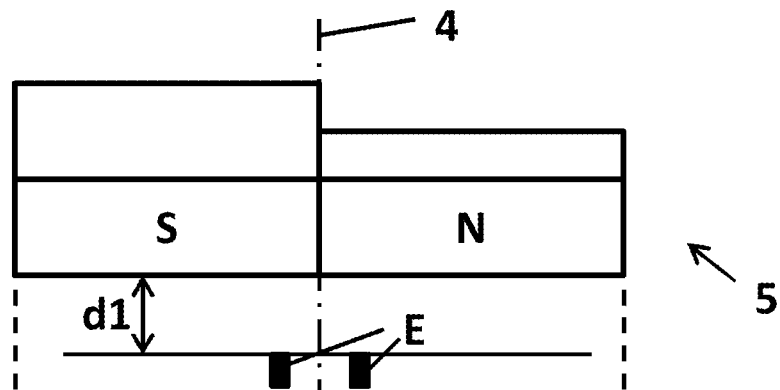
FIG. 31(a) and FIG. 31(b) show an example of a four-pole disk magnet having a non-constant thickness.
Figure 31B:
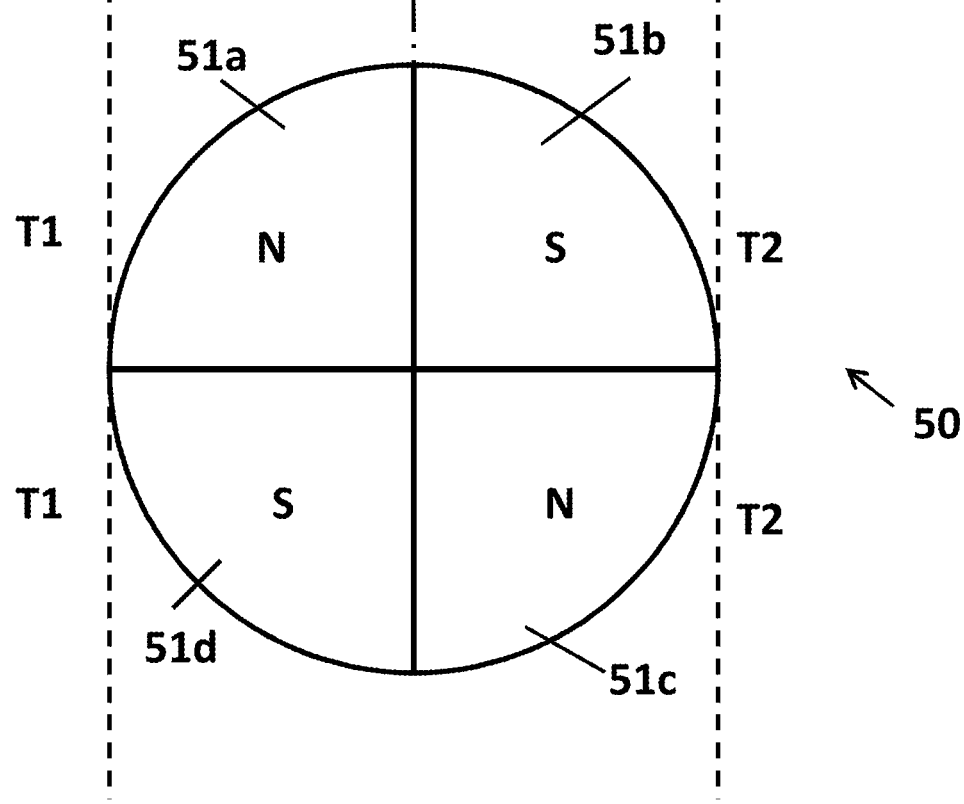

FIG. 31 shows an example of a four-pole disk magnet 50 having a non-constant thickness. For example, the segments 51a and 51d have a first thickness T1 and the segments 51b and 51c have a second thickness T2 different from the first thickness T1. In another example (not shown), the segments 51a, 51b and 51c would have a first thickness T1 and the segments 51d would have a second thickness T2 different from the first thickness T1. Despite the fact that this magnet consists of a single piece of magnetic material (but specifically shaped and magnetized), such a magnet will create a magnetic field which can be considered as the superposition of a primary magnetic field in the form of a regular quadrupole, and a secondary magnetic field in the form of one or more dipoles, and optionally some higher order terms which have no significant influence on the behavior of the sensor, very similar to the magnetic field created by the magnet shown in FIG. 10. In this example, the variation in thickness causes the secondary magnetic field Bs.

FIG. 32 and FIG. 33 show examples of a magnet as can be used in embodiments of the present invention, having a central portion in the form of a regular 4-pole disk magnet (with constant thickness and segments of 90° and mounted such that the geometrical center of the magnet coincides with the rotation axis) and having an outer portion in the form of two ring segments acting as two vertical dipoles (assuming they are vertically magnetized, in the depth direction of the drawing). The secondary field created by these ring segments was shown in FIG. 20 and FIG. 21.

FIG. 32 and FIG. 33 show two examples of similar magnet assemblies, but having a different angular offset between the quadrupole 32 and the two ring segments 33. In other embodiments (not shown), another relative angular position of the quadrupole 32 and the dipoles 33 could be chosen, for example 10° or 20° or 30° or any other value. The relative angular position (e.g. angular offset) may be hardcoded or may be stored in a non-volatile memory. The embodiment of FIG. 32 is expected to provide the same symmetry advantages as discussed in relation to FIG. 16, but that is not required for the invention to work.

Figure 34:
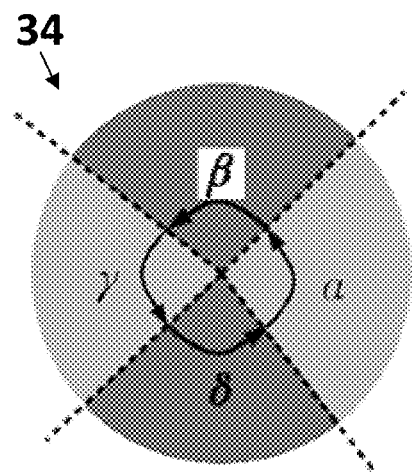

FIG. 34 shows an example of an irregular 4-pole disk magnet 34 having four disk segments, at least one of which defines an angle different from 90°, for example an angle in the range from 92° to 110°. Simulations have shown that such a magnet will create a magnetic field which can be considered as the superposition of a primary magnetic field in the form of a regular quadrupole, and a secondary magnetic field in the form of one or more dipoles, and optionally some higher order terms which have no significant influence on the behavior of the sensor. In this example, the variation of the segment angles causes the secondary magnetic field Bs.

Figure 35:
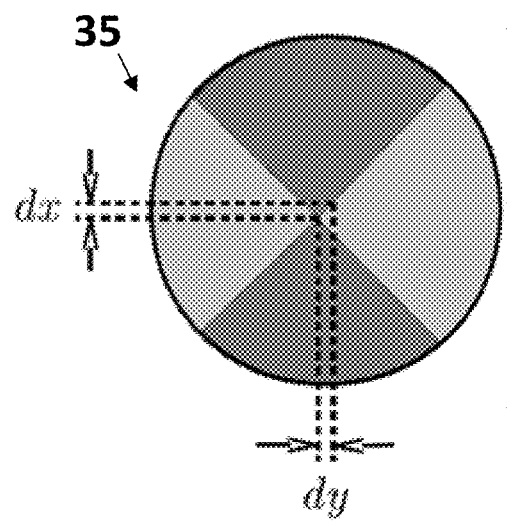

FIG. 35 shows another example of an irregular 4-pole disk magnet 35 having four disk segments, defining angles of 90°, but the magnetic center (i.e. the location where the magnetic field components Bt, Br and Bz are zero, see FIG. 5, FIG. 7 and FIG. 9 does not coincide with the geometrical center of the magnet. Simulations have shown that such a magnet will create a magnetic field which can be considered as the superposition of a primary magnetic field in the form of a regular quadrupole, and a secondary magnetic field in the form of one or more dipoles, and optionally some higher order terms which have no significant influence on the behavior of the sensor. In this example, the offset of the magnetization causes the secondary magnetic field Bs, when this magnet is mounted with its geometrical center on the rotation axis 4. The primary magnetic field Bp of this magnet is not perfectly rotation symmetrical, but if the offset dx, dy is sufficiently small relative to the radius of the first circle, the primary magnetic field "seen" by the primary sensor elements in combination with the "second algorithm" will provide exactly the same primary angle α1 as would be the case if the magnet would be perfectly regular (with dx=0 and dy=0). In this example, the offset dx, dy causes the secondary magnetic field Bs.

In particular embodiments, the outer diameter of the magnet may be smaller than 20 mm or smaller than 10 mm, and the offset dx and/or dy would be a value of least 3% of the outer diameter of the disk magnet, for example at least 5%, for example at least 10% or at least 15% or at least 20%.

Figure 36:
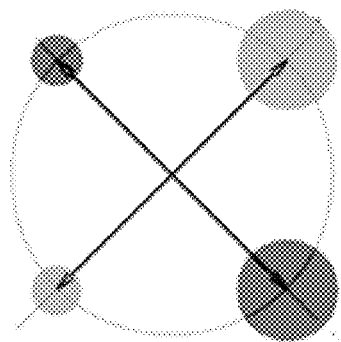
Figure 37:
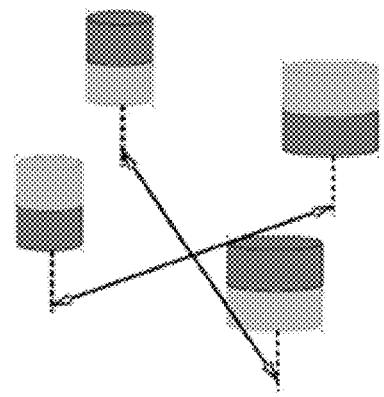
Figure 38:
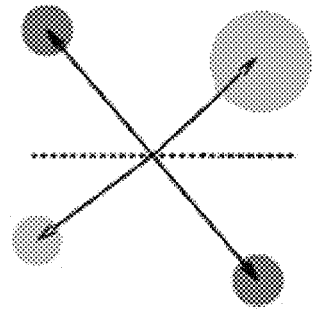
Figure 39:
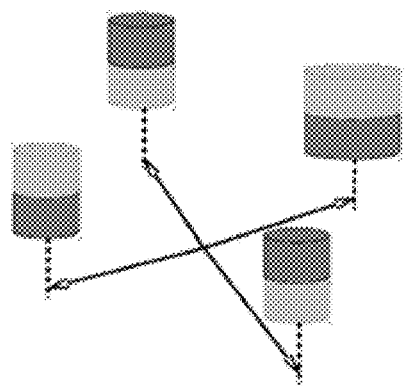

FIG. 36 (top view) and FIG. 37 (perspective view) show a permanent magnet assembly composed of four discrete cylindrical dipole magnets, two of a first size and two of a second size different from the first size. FIG. 38 (top view) and FIG. 39 (perspective view) show a permanent magnet assembly composed of four cylindrical dipole magnets, three of a first size, one of a second size different from the first size. These cylindrical dipole magnets would be held together by means of a non-magnetic material, such as an epoxy or a polymer or any other suitable material. These magnets can be seen as the combination of a quadrupole and one or two vertical dipoles. The ratio of the second size (e.g. diameter) and the first size (e.g. diameter) may for example be chosen in the range from 200% to 105%, for example about 120% or about 130% or about 140% or about 150%, but other values may also be used. It is expected that even for a ratio of 120% the signal Bz as for example shown in FIG. 14(d) is sufficiently large to allow a reliable decision as to whether or not 180° needs to be added, even without correction of the values (step 174), in the presence of moderate external fields.

Figure 40:
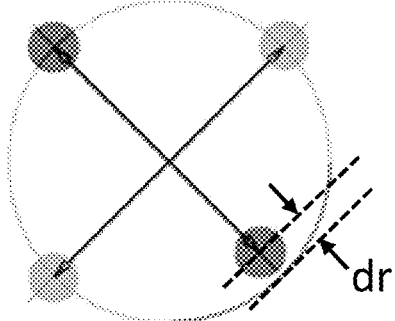

FIG. 40 is a top view of a magnet assembly consisting of only four cylindrical dipole magnets of the same size, all oriented in a same upright position (e.g. under 90° with respect to the sensor plane). Three dipoles are located on a circle having a center located on the rotation axis, but one of the dipoles is radially shifted inwards or outwards over a distance dr.

Figure 41:
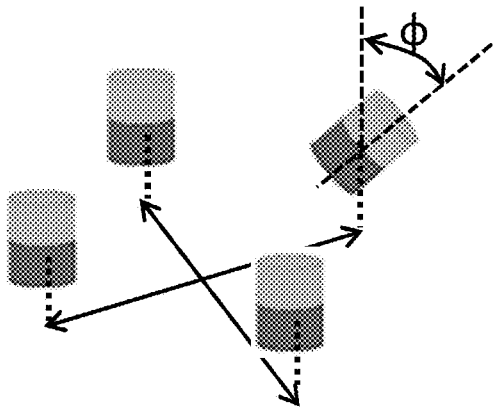

FIG. 41 is a top view of a magnet assembly consisting of only four cylindrical dipole magnets of the same size, all located on a circle having a center located on the rotation axis. Three dipoles are oriented perpendicular to the sensor plane, one of the dipoles is tilted under an angle φ in the range from 5° to 80° with respect to the normal to said sensor plane, preferably in the range from 10° to 30°.

The magnets shown in FIG. 31, FIG. 34, FIG. 35 and FIG. 38, FIG. 39, FIG. 40 and FIG. 41 are examples to show that a multi-pole magnet having a deliberate irregularity, in the form of for example a thickness variation, or a variation of segment angle, or a variation of offset between magnetic center and geometric center, or a variation of size of individual magnets, or a radial shift inwards or outwards, or a tilt angle, or combinations hereof, can create a magnetic field which can be considered as the superposition of a primary magnetic field which is substantially rotation symmetric about the rotation axis 4 (with periodicity of 360°/(N/2) in case of a multipole magnet with N magnetic poles, e.g. a periodicity of 180° in case of a quadrupole), and a secondary magnetic field which is not rotation symmetric.

Figure 42:
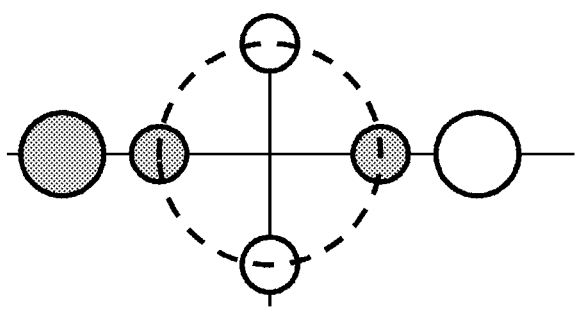

FIG. 42 (top view) shows a permanent magnet assembly, composed of six cylindrical dipole magnets, four (inner) cylindrical dipoles of a first size together forming a regular quadrupole and two (outer) cylindrical dipoles of a second size creating the secondary magnetic field. The second size can be smaller than, equal to, or larger than the first size. The rotation axis of the so-formed quadrupole lies exactly in the middle between the two outer dipoles. This embodiment is expected to provide the same symmetry-advantages as discussed in relation to FIG. 16, but that is not required for the invention to work.

In a variant of this embodiment (not shown), one of the outer dipoles is omitted.

Figure 43:
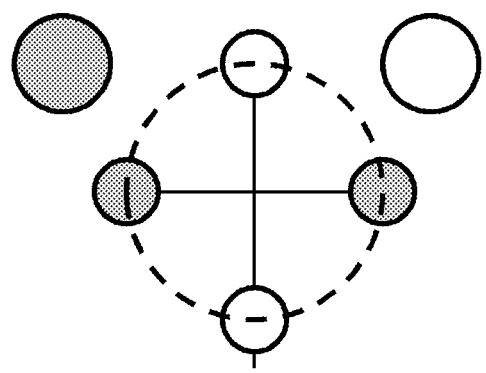
Figure 44:
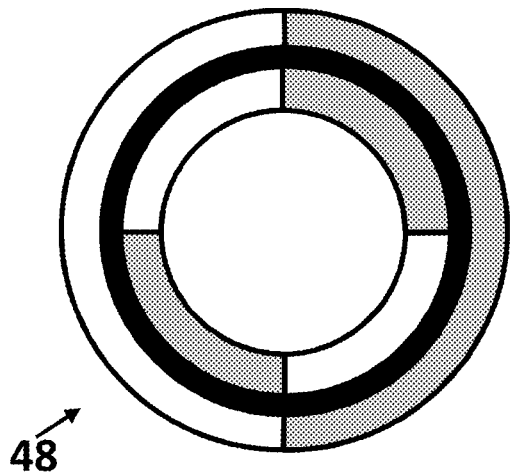
Figure 45:
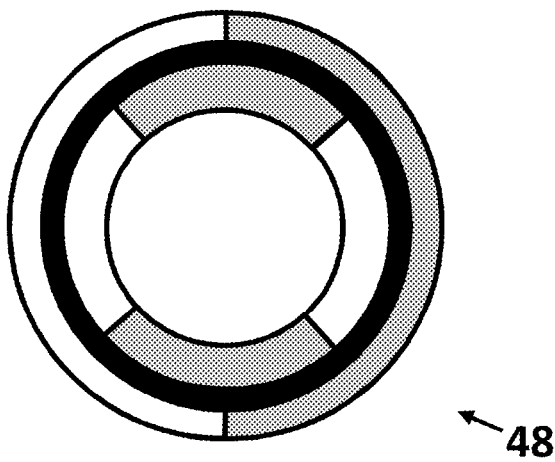
Figure 46:
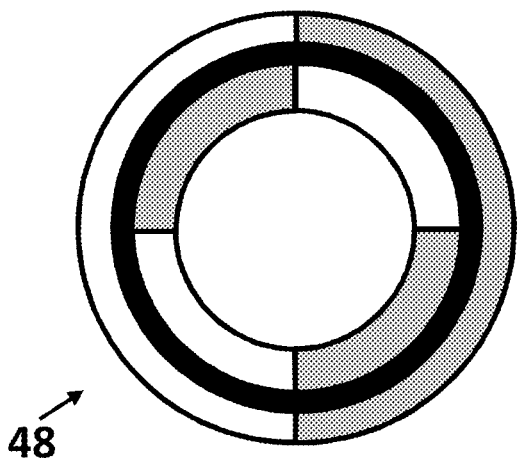
Figure 47:
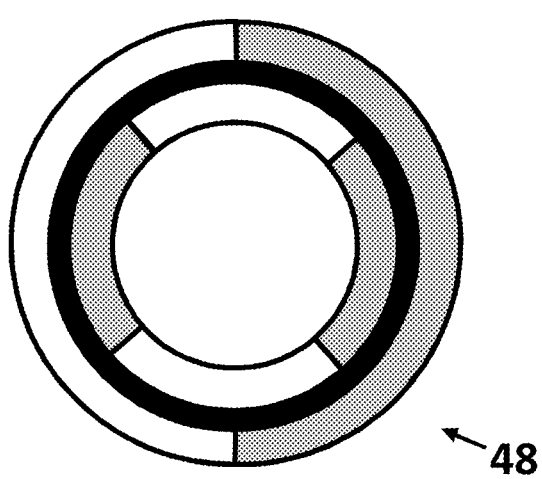
Figure 48:
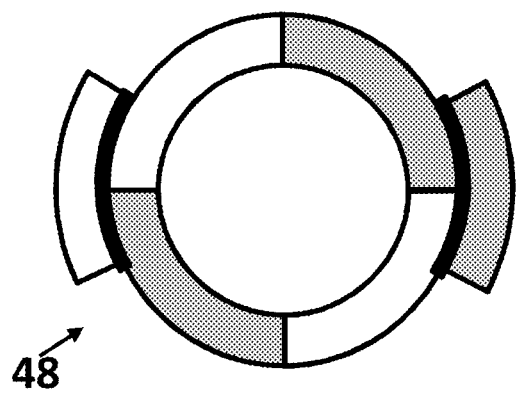

FIG. 43 is a variant of the magnet assembly shown in FIG. 42, where the two outer cylindrical magnets are not aligned on opposite sides of the rotation axis of the quadrupole formed by the four inner dipoles.

In a variant of the embodiments of FIG. 42 and FIG. 43, all six cylindrical dipoles have the same size, which is advantageous when producing such magnet assemblies.

FIG. 44 to FIG. 48 show several embodiments of magnet assemblies 48 having an inner portion in the form of a regular 4-pole ring magnet, and two outer segments in the form of ring segments. It is noted that for practical reasons, the ring portions and the ring segments may be positioned at a small distance from each other, and held together, e.g. using epoxy or a polymer, as suggested by the black zone in between both. The angular position of the outer portions may be chosen independently from the angular position of the inner portion, but as explained above, some embodiments may provide the same symmetry-advantages as discussed in relation to FIG. 16, although that is not required for the invention to work. In embodiments of the present invention, as for instance illustrated in FIG. 49, the ring segments need not completely surround the ring portions of the 4-pole ring magnet.

In a variant of these embodiment (not shown), one of the outer ring segments is omitted.

Figure 49:
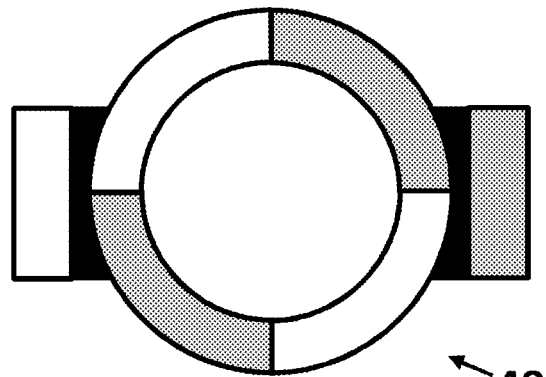
Figure 50:
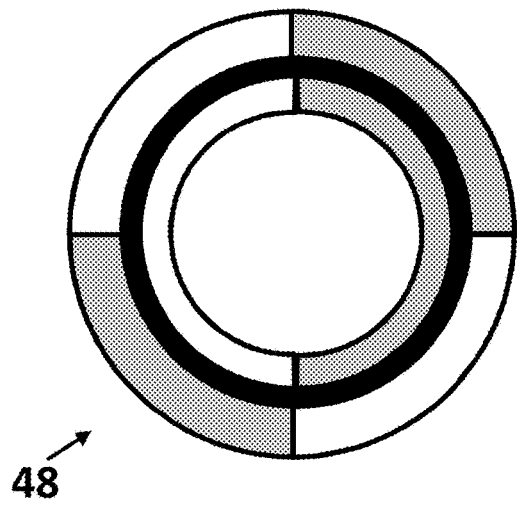
Figure 51:
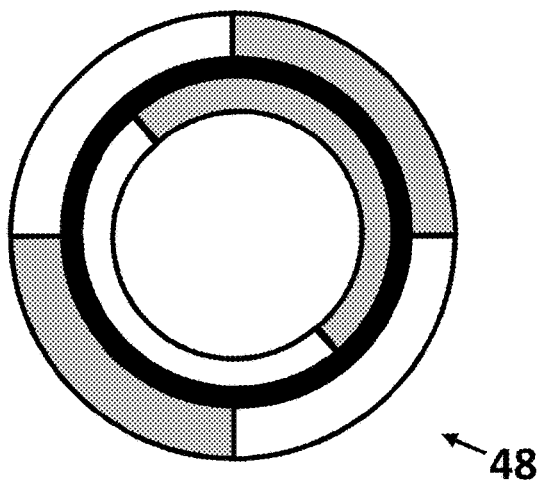
Figure 52:
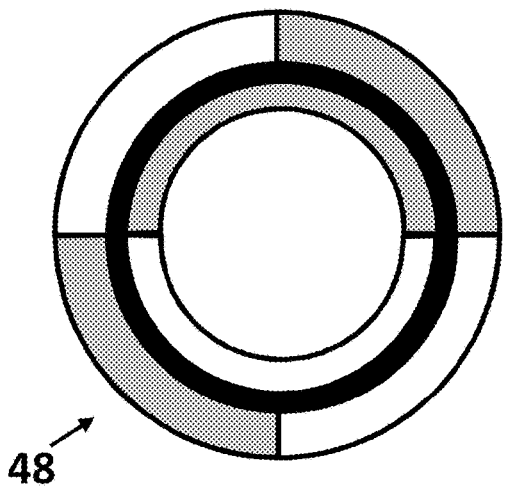
Figure 53:
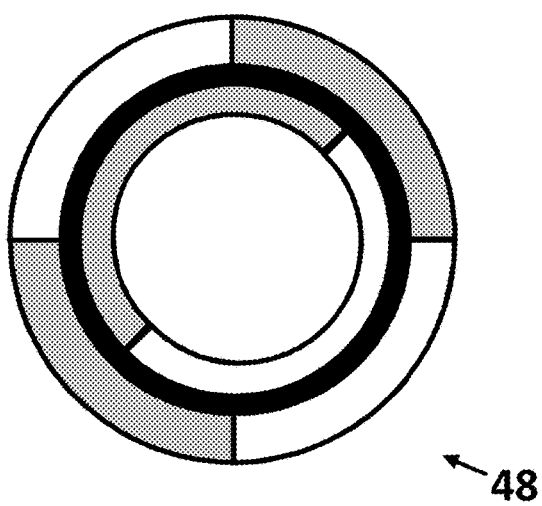
Figure 54:
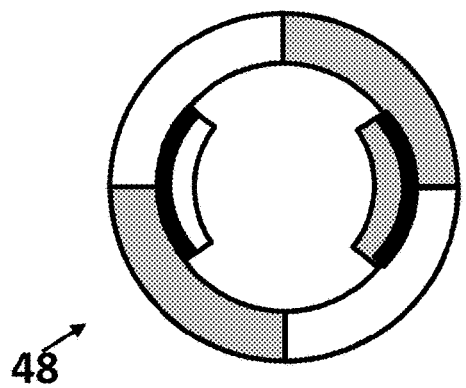
Figure 55:
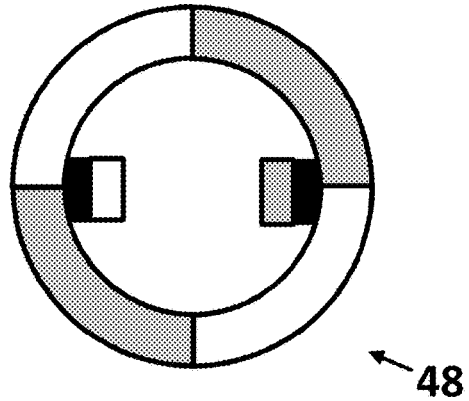
Figure 56:
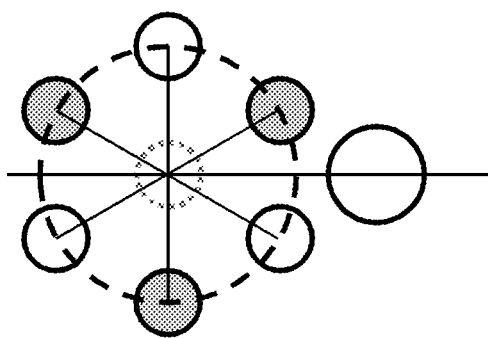
Figure 57:
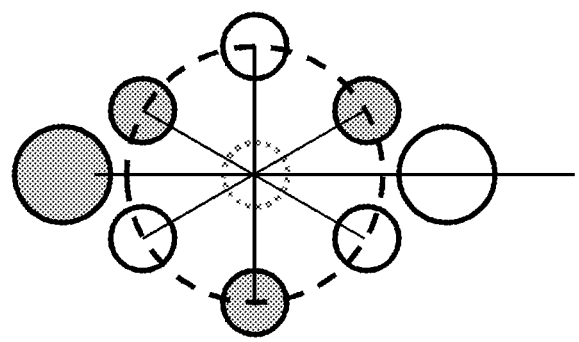
Figure 58:
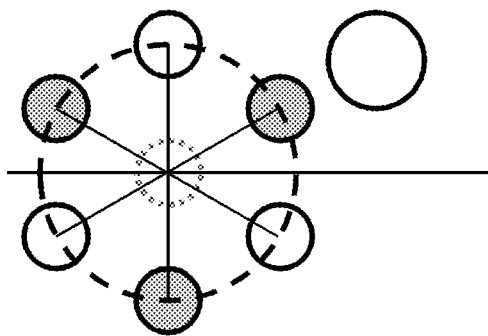
Figure 59:
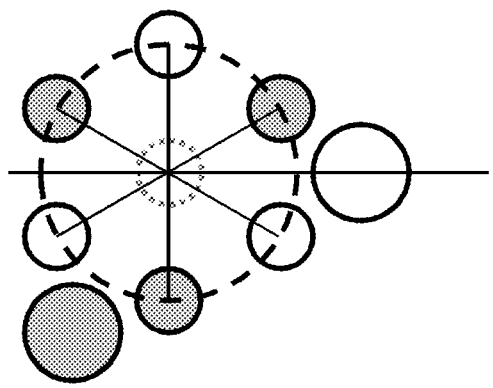
Figure 60:
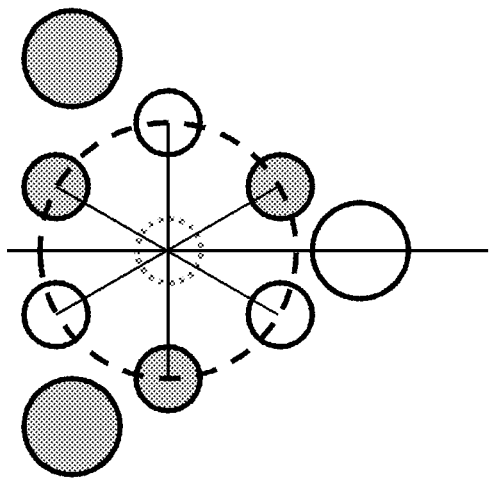

FIG. 49 shows a magnet assembly with an inner portion in the form of a regular 4-pole ring magnet, and two vertical dipoles in the form of beams. In a variant of this magnet, the two outer portions would be two cylindrical magnets, or magnets of any other suitable shape.

FIG. 50 to FIG. 55 are variants of the magnets shown in FIGS. 44 to 49, having an outer portion in the form of a regular 4-pole ring magnet, and inner portions for forming the secondary magnetic field. These magnets are expected to provide very similar results as those of FIGS. 44 to 49.

In variants of these magnets (not shown) one of the inner portions is omitted.

Magnet with Six-Pole:

FIG. 56 to FIG. 60 show several examples of magnet assemblies for forming a rotation-symmetrical 6-pole (with 120° periodicity), and one single or only two or only three vertical dipoles for forming the secondary magnetic field Bs, as can be used in embodiments of the present invention.

These magnets are to be used in conjunction with a sensor device 6 having twelve primary sensor elements divided in 4 groups S,T,U,V, three primary elements per group, in the way as described in WO'885, and as shown for example in FIG. 23 and FIG. 25 thereof. The primary sensor elements may be vertical Hall elements adapted for measuring a radial field component (as in FIG. 22 of WO'885), or may be vertical Hall elements adapted for measuring a tangential field component (as in FIG. 23 of WO'885), or may be horizontal Hall elements covered by IMC (as in FIG. 24 to FIG. 27 of WO'885). Instead of the formulas [3] to [16] applicable for a quadrupole, the following formulas [17] and [18], or equivalent formulas would be used in this case:

$$\text{diff1} = (S1+S2+S3) - (U1+U2+U3) \quad [17]$$

$$\text{diff2} = (T1+T2+T1) - (V1+V2+V3) \quad [18]$$

It is expected that all magnets of FIG. 56 to FIG. 60, and variants of the magnets of FIG. 31 to FIG. 55 where the four-pole disk/ring/cylinder is/are replaced by a six pole disk/ring/cylinders, will work in combination with such a sensor, in the sense that an angle $\alpha$ will be determined in a 360° range, with no or only minor influence on the accuracy on the primary angle $\alpha 1$. It is expected that for the magnet of FIG. 57 the formulas [17] and [18] are completely insensitive for the secondary field Bs generated by the two dipoles, whereas for the other magnets of FIG. 56 and FIG. 58 to FIG. 60 the secondary magnetic field Bs will probably have some more influence, causing some inaccuracy in the primary angle $\alpha 1$. But for the same reasons as explained above, the inaccuracy is expected to be smaller than about 2°, and the accuracy is expected to improve as the first radius decreases and/or the distance between the rotation axis and the longitudinal axis of the dipole increases, and/or the strength of the secondary magnetic field decreases relative to the primary field. In step 175 of the method (see FIG. 17) it would be decided whether 0° or 120° or 240° needs to be added corresponding to M=0, 1 or 2 respectively, the uncertainly angle or periodicity UA=120° in the case of a 6-pole). As described above, the best value for M can be based on a plurality of at least two, or at least three, or at least four, e.g. six or eight or twelve secondary signals SEi, which may be signals obtained from a plurality of at least two or at least three additional horizontal Hall elements XEi, or may be the same signals as the primary sensor signals. The signals SE or S1 to V2 may optionally be corrected (see method step 174 of FIG. 17).

In variants of the magnet assemblies shown in FIG. 56 to FIG. 60, (not shown), instead of the six cylindrical dipoles, the six-pole magnet could be a disk magnet having six segments, and the dipole(s) could be ring segments, similar to FIG. 32 and FIG. 33, but the quadrupole would be replaced by a six-pole. The number of outer ring segments would remain two.

In other embodiments (not shown), instead of the six cylindrical dipoles, the six-pole magnet could be a ring magnet having six segments, and the one or two or more dipoles could be ring segments or beams, similar to FIG. 44 to FIG. 55, but the ring with four ring segments would be replaced by a ring having six ring segments.

In a variant of the magnet shown in FIG. 31, a six-pole disk magnet having six segments, where at least on segment has a thickness different from the other segments, is provided.

In a variant of the magnet shown in FIG. 34, a six-pole disk magnet having six segments, where at least on segment defines an angle different from 60°, for example in the range from 45° to 75°, or in the range from 50° to 70°, or in the range from 55° to 65° is provided.

In a variant of the magnet shown in FIG. 35, a six-pole disk magnet having six segments, where the magnetic center is not coinciding with the geometrical center of the magnet, is provided.

From the above, the skilled person having the benefit of the present disclosure, can easily extend the teaching of the present invention to an eight-pole magnet, or higher order magnet.

While many examples are given with cylindrical magnets, the invention will of course also work with magnets having other shapes, like for example beam-shaped magnets (having a square or rectangular cross section).

Although the invention has been described with a permanent magnet creating the magnetic field, the invention will also work with a magnet in the form of a back bias magnet, or at least one coil.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

The invention claimed is:

1. A magnetic sensor arrangement comprising:
a magnet assembly and a magnetic sensor,
the magnet assembly forming a magnetic field having at least two magnetic field components with different angular periodicities with respect to a same unique rotation axis at the location of the magnetic sensor, and the magnetic sensor including means for sensing the different magnetic field components to produce at least a first sensor element signal and a second sensor element signal; and a computing element for receiving the first and second sensor element signals and for combining the first and second sensor element signals to produce a unique angular position of the magnet assembly relative to the sensor.

2. The magnetic sensor arrangement of claim 1, wherein the magnet assembly is a single magnet, meaning a contiguous element of magnetized material.

3. The magnetic sensor arrangement of claim 1, wherein the magnet assembly has two or more magnetic poles of different magnitudes.

4. The magnetic sensor arrangement of claim 3, wherein the magnet assembly has different sectors and the different magnitudes are a result of the differential sector magnetization of the magnet assembly.

5. The magnetic sensor arrangement of claim 4, wherein the differential sector magnetization is a result of different sectors magnetization strength or different sectors areas, or a combination thereof.

6. The magnetic sensor arrangement according to claim 1, wherein the magnet assembly comprises a permanent magnet.

7. The magnetic sensor arrangement according to claim 1, wherein the magnet assembly is an arrangement of coils, and a magnet controller.

8. The magnetic sensor arrangement of claim 7, wherein the magnet assembly has two or more poles of different magnitudes and the magnet controller provides different voltages to a current to the coils to form the poles of different magnitudes.

9. The magnetic sensor arrangement according to claim 1, wherein the magnetic sensor comprises two or more sensor elements.

10. The magnetic sensor arrangement according to claim 1, wherein the computing element includes a circuit for combining the first and second sensor elements signals to produce the unique angular position of the magnet assembly relative to the sensor.

11. The magnetic sensor arrangement according to claim 1, wherein the magnetic sensor has a surface and two or more sensing elements, providing an electrical output and disposed at the surface of the magnetic sensor.

12. The magnetic sensor arrangement according to claim 11, wherein the electrical output of the sensing elements are linearly combined to produce the first and second sensor element signals.

13. The magnetic sensor arrangement according to claim 12, wherein the magnetic field sensing elements are sensitive to a magnetic field that is perpendicular to the surface, or parallel to the surface or a combination thereof.

14. The magnetic sensor arrangement according to claim 1, wherein the computing element means do not include a Fourier transformation circuit.

15. A method of determining a unique angular position of a magnet assembly relative to a magnetic sensor, the magnet assembly forming a magnetic field having at least two magnetic field components with different angular periodicities with respect to a same unique rotation axis at the location of the magnetic sensor;

the magnetic sensor including means for sensing and a computing element;

the method comprising the steps of:

sensing the different magnetic field components to produce at least a first sensor element signal and a second sensor element signal using the means for sensing of the magnetic sensor; and receiving the first and second sensor element signals and combining the first and second sensor element signals to produce said unique angular position using the computing means.

\* \* \* \* \*